United States Patent [19]

Maekawa et al.

[11] Patent Number: 5,633,610
[45] Date of Patent: May 27, 1997

[54] MONOLITHIC MICROWAVE INTEGRATED CIRCUIT APPARATUS

[75] Inventors: Itaru Maekawa; Takahiro Ohgihara; Kuninobu Tanaka, all of Kanagawa, Japan

[73] Assignee: Sony Corporation, Tokyo, Japan

[21] Appl. No.: 536,245

[22] Filed: Sep. 29, 1995

Related U.S. Application Data

[62] Division of Ser. No. 179,048, Jan. 7, 1994, Pat. No. 5,486,787.

[30] Foreign Application Priority Data

| Jan. 8, 1993 | [JP] | Japan | 5-016795 |
| Mar. 18, 1993 | [JP] | Japan | 5-085641 |
| Mar. 29, 1993 | [JP] | Japan | 5-069976 |

[51] Int. Cl.$^6$ ..................................... G06G 7/14
[52] U.S. Cl. ............... 327/355; 327/124; 327/307; 327/361; 327/362; 327/430
[58] Field of Search ............ 327/91, 94, 124, 327/307, 339, 355, 361, 362, 430, 431

[56] References Cited

U.S. PATENT DOCUMENTS

| 3,408,511 | 10/1968 | Bergersen et al. | 327/124 |
| 3,757,139 | 9/1973 | Hunter | 327/430 |
| 4,142,118 | 2/1979 | Guritz | 327/143 |
| 4,158,149 | 6/1979 | Otofuji | 327/430 |
| 4,504,796 | 3/1985 | Igarashi | 330/296 |
| 4,645,999 | 2/1987 | Szepesi | 323/315 |
| 4,647,841 | 3/1987 | Miller | 327/530 |
| 4,686,387 | 8/1987 | Rumelhard | 327/543 |
| 4,716,356 | 12/1987 | Vyne et al. | 327/362 |
| 4,810,911 | 3/1989 | Noguchi | 327/431 |
| 5,128,556 | 7/1992 | Hirakata | 327/541 |
| 5,164,679 | 11/1992 | Dittmer | 330/298 |
| 5,166,553 | 11/1992 | Kotera et al. | 326/115 |
| 5,225,720 | 7/1993 | Kondoh et al. | 327/546 |
| 5,243,231 | 9/1993 | Baik | 327/546 |
| 5,323,071 | 6/1994 | Hirayama | 327/543 |
| 5,361,007 | 11/1994 | Ohta | 327/427 |
| 5,373,226 | 12/1994 | Kimura | 323/313 |
| 5,444,399 | 8/1995 | Shiga | 327/355 |

FOREIGN PATENT DOCUMENTS

| 0218333 | 4/1987 | European Pat. Off. . |
| 0516134A1 | 12/1992 | European Pat. Off. . |
| 0150140 | 7/1985 | France . |
| 0449720A1 | 10/1991 | France . |
| 2435636 | 2/1975 | German Dem. Rep. | 327/430 |

OTHER PUBLICATIONS

Very High Performance D.C. Coupled MMIC FET Amplifiers, Mauri et al, P1761–1765, Telettra S.p.A., Via Trento 30, 20059 Vimercate (MI) Italy.

*Primary Examiner*—Terry Cunningham
*Attorney, Agent, or Firm*—Hill, Steadman & Simpson

[57] ABSTRACT

A monolithic microwave semiconductor integrated circuit including a bias stabilizing circuit of a current mirror type formed of a bias control transistor formed of an enhancement mode compound semiconductor field effect transistor and a biased transistor formed of an enhancement mode compound semiconductor field effect transistor.

2 Claims, 19 Drawing Sheets

GATE BIAS VOLTAGE Vgg (V)

MONOLITHIC MICROWAVE INTEGRATED CIRCUIT APPARATUS

This is a division of application Ser. No. 08/179,048, filed Jan. 7, 1994, now U.S. Pat. No. 5,486,787.

FIELD OF THE INVENTION

The present invention relates to a bias stabilizing circuit of a field effect transistor formed of a compound semiconductor for use in a bias stabilizing circuit of a monolithic microwave semiconductor integrated circuit and a circuit using the same.

DESCRIPTION OF THE PRIOR ART

In the field of apparatus that are required to be miniaturized and made inexpensive, such as digital cordless telephones, communication equipment units small radars or the like, a development of a monolithic microwave semiconductor integrated circuit (hereinafter simply referred to as an MMIC) in which a passive circuit also is simultaneously manufactured on a semi-insulating substrate such as GaAs or the like by using a manufacturing process of a field effect transistor (hereinafter simply referred to as an FET) has been advanced. The MMIC generally uses a GaAs MESFET as an FET.

Since a crystalinity of a GaAs substrate is not so excellent as compared with that of a silicon semiconductor substrate, a substrate is formed of two elements so that an ion implantation process is difficult to be controlled and an electric field distribution brought about by a piezo-electric effect is fluctuated due to a semi-insulating substrate or the like, it is impossible to control a threshold voltage VTH of an FET with high accuracy in the present manufacturing process of the present GaAs MESFET. In the case of the GaAs-system device, a value of a mutual conductance gm is as large as about 100 and a fluctuation of a drain current Id due to the fluctuation of the threshold voltage VTH is large. Since a gain of the MMIC depends on a drain current id, the drain current id must be made absolutely constant, which requires a bias stabilizing circuit.

If a fixed bias system formed of a resistance type potential divider or the like is used, for example, then when the MMIC is assembled into various apparatus, a bias voltage must be adjusted. Further, since the threshold voltage VTH has a temperature dependence, the value of the mutual conductance gm is large so that the threshold voltage VTH is easily fluctuated by about 0.1 V in a temperature range of 100° C., for example. As a result, a characteristic of the FET is fluctuated considerably with the change of temperature, which requires a temperature compensating circuit formed of a thermistor or the like.

Therefore, the MMIC formed of the GaAs MESFET must stabilize the bias and the bias must be made free from adjustment. One of such bias systems is a voltage feedback self-bias system shown in FIG. 1 of the accompanying drawings. As shown in FIG. 1, because the source portion of an FET 1 is directly grounded, this voltage feedback type self-bias system has an advantage that a distortion of a signal is small but has a disadvantage that the bias is not stable. Therefore, it is customary that a current feedback type self-bias system in which a resistor R7 is connected to the source portion of an FET 2 as shown in FIG. 2 is used. The bias system shown in FIGS. 1 and 2 are DC equivalent circuits.

However, the resistor R7 is connected to the source portion of the FET 2, and gain of the signal amplified by the FET 2 is reduced. Therefore, the current feedback type self-bias system includes a bypass capacitor C1 in order to increase the gain of the amplified signal. It is sufficient that a capacitance of the bypass capacitor C1 is about several 10 s of picofarads when the MMIC is operated at a frequency of, for example, about 2 GHz in the transmission system. Accordingly, there is substantially no difference in gain as compared with the case where the source portion is directly grounded irrespective of a bias stability.

When the current feedback type self-bias system is used as the MMIC used in a high frequency signal reception system, however, in order to improve a three-order cross modulation distortion output that is particularly an important problem, it is not sufficient that the capacity of the bypass capacitor C1 is about several 10 s of picofarads. To obtain a characteristic that is substantially the same as that obtained when the source portion of the FET 2 is directly grounded, the capacitance of the bypass capacitor C1 must be increased more than several 100 s of picofarads. Incidentally, the three-order cross modulation distortion output will be described fully later on.

When a bypass capacitor having a capacitance of several 100 s of picofarads or more is formed on the MMIC by an MIM (metal insulator metal) structure, if a 0.2 μm-thick silicon nitride film having a specific inductive capacity of 7 is used as an insulating film, then an area of the bypass capacitor C1 becomes several squares millimeters, which is not practical. When the bypass capacitor C1 is connected thereto from the outside as a chip assembly part, the number of package pins is increased. In addition, when the bypass capacitor C1 is applied to a high frequency of about 2 GHz, there are many restrictions that an inductance of a bonding wire cannot be neglected.

Further, when the resistor R7 is connected to the source portion of the FET 2, a potential difference between the drain portion and the source portion is reduced by an amount corresponding to a voltage drop across the resistor R7 so that an output dynamic range of the FET 2 is decreased. There is then the problem that a power consumption is increased by the resistor R7. These problems become remarkably serious when the FET is operated at low voltage or with a large amplitude.

As earlier noted, the MMIC generally uses the GaAs MESFET. In the MESFET that is placed in the enhancement mode, a diffusion potential $\phi d$ is about 0.6 V at most and therefore the threshold voltage VTH cannot be made high. Accordingly, when the MESFET is used, an operation margin for the fluctuation of the threshold voltage VTH is small so that a negative power supply is required. Hence, the MESFET cannot be driven by a single power supply of low voltage.

The device per se will be described next. The GaAs semiconductor is inferior in crystalinity as compared with the silicon semiconductor and a semiconductor is formed of two elements. Therefore, the control of the ion implantation process of impurity is difficult. Also, because the semi-insulating substrate is used, an electric charge distribution due to a piezo-electric effect is fluctuated. Thus, in the existing manufacturing process of the GaAs FET, the threshold value Vth of the FET cannot be substantially controlled with high accuracy substantially. A value of a mutual conductance $g_m$ of the GaAs FET is as large as about several 100 s ms/mm, and therefore a drain current Id is fluctuated considerably with the fluctuation of the threshold voltage Vth. Since the gain of the MMIC depends upon the drain current Id, the drain current must be made constant, which requires the MMIC to have the bias stabilizing circuit therein.

In order to supply the fixed bias voltage to the MMIC, the bias voltage must be adjusted when the MMIC is assembled into various type of equipment. Furthermore, since the threshold voltage Vth has a temperature dependence and has a large mutual conductance $g_m$, the threshold voltage Vth is easily fluctuated by about 0.1 V in a temperature range of, for example, 100° C. As a result, the FET characteristic is considerably fluctuated with the change of temperature, which requires a temperature compensation circuit formed of a thermistor or the like.

Therefore, in the MMIC formed of the GaAs FET, the bias must be stabilized and the adjustment of the bias must be removed.

An example of the related-art bias circuit formed of the MMIC of the enhancement type GaAs FET will be described with reference to FIG. 3. As shown in FIG. 3, an MMIC 10 is formed of a plurality of FETs (N-channel type FETs) 17, 18, 19 that are connected at their drains and sources in parallel to one another from a DC standpoint. The drains of the respective FETs 17, 18, 19 are commonly connected to lead out a drain terminal 1D, and the sources thereof are commonly connected through gate resistors R14, R15, R16 to lead out a gate terminal 1G. In this example, the FETs 17, 18, 19 are each MES (metal-semiconductor)—FETs.

The bias circuit will be described next. This bias circuit is a voltage feedback self-bias type circuit. A series circuit of resistors R11, R12, R13 sequentially connected is interposed between a power supply +B and the ground. A junction between the resistors R11 and R12 is connected to the drain terminal 1D. A junction between the resistors R12 and R13 is connected to the gate terminal 1G, and the source terminal 1S is grounded.

Because the sources of the FETs 17, 18, and 19 are directly grounded, the bias circuit of this voltage feedback type self-bias system has an advantage that a signal distortion is small, but has a defect that a bias stability is low.

There is proposed a bias circuit of a current feedback type self-bias system in which bias resistors R24, R26 are interposed between the sources of FETs 21 and 22 and ground in addition to the circuit arrangement shown in FIG. 3 as shown in FIG. 4. In FIG. 4, reference symbols C2, C3 represent bias capacitors respectively connected to the bias resistors R24, R26 in parallel.

It is sufficient that the capacitance of each of the bypass capacitors C2, C3 is about several 10 s of picofarads when the signal frequency is 2 GHz irrespective of the cross modulation distortion characteristic. Also, irrespective of the bias stability, the increase of the gain of the FETs 21, 22 is very small as compared with the case when the sources of the FETs 21, 22 are directly grounded.

When the bias circuit of the current feedback type self-bias system is provided on the FETs in the MMIC used in the high frequency signal reception system, the capacitance of the above-mentioned bypass capacitor must be selected to be more than several 100 s of picofarads in order to improve a three-order cross modulation distortion output. In this case, it is very difficult to incorporate such a bypass capacitor within the MMIC. Moreover, if such a bypass capacitor is connected to the MMIC from the outside, then it is unavoidable that the number of terminal pins in the MMIC is increased to that extent. In this connection, when the capacitor whose capacitance is 100 pF is formed into the MMIC, if the capacitor is sandwiched by a metal film of an insulating layer (0.2 μm-thick silicon nitride film having a specific inductive capacitance of 7), its area becomes several square millimeters, which is not practical. Also, when the signal frequency becomes 2 GHz, an inductance of the bonding wire cannot be neglected.

Further, when the bias resistor is connected to the source of the FET, a voltage between the drain and the source is lowered by an amount corresponding to the voltage drop across such a resistor. As a consequence, a dynamic range of the FET is reduced, and the power consumption of that resistor becomes useless.

The assignee of the present application has previously proposed an FET bias stabilizing circuit (not laid-open when the present application is filed) formed of a compound semiconductor in which a bias stability is high, an operation margin against a fluctuation of a threshold voltage Vth is large, and which can be driven by a single low voltage power supply.

An example of a prior-art bias stabilizing circuit for the MMIC made of a GaAs enhancement type FET will be described with reference to FIG. 5. Similarly as described above, in an MMIC 30, a plurality of FETs (N-channel type FETs) 31, 32, and 33 are connected in parallel to one another at their drains and sources from a DC standpoint. The drains of the FETs 31, 32, and 33 are commonly connected to lead out a drain terminal 3D, and sources thereof are commonly connected to lead out a source terminal 3S. Also, the gates of the FETs 31, 32, 33 are commonly connected through gate resistors R33, R34, R35 to lead out a gate terminal 3G. In FIG. 5, each of the FETs is a J (junction type)—FET or MES-FET.

The bias circuit will be described next. This bias circuit is a current-mirror type bias circuit. As shown in FIG. 5, between the power supply +B and the ground, there is connected a series circuit formed of a resistors R31, R32, and a drain and a source of an FET (N-channel type FET) 34 whose drain and gate are directly coupled. A junction between the resistors R31, R32 is connected to the drain terminal 3D, the drain (gate) of the FET 34 being connected to the gate terminal 3G, and the source terminal 3S being grounded. The FET 34 is the J-FET or MES-FET and is formed of the same kind of FETs 31, 32, 33.

An example of a practical circuit of the example of the prior art shown in FIG. 5 will be described with reference to FIG. 6. As shown in FIG. 6, a signal input terminal Tin is led out from the gates of FETs 41, 42 of the MMIC through a coupling capacitor C6, and a signal output terminal Tout is led out from the drains of the FETs 41, 42 through a coupling capacitor C7. Drains of the FETs 41, 42 are connected through coils (inductances) L1, L2 serving as loads to a drain terminal 4D, and the drain terminal 4D is grounded through a capacitor C8 which presents a low impedance relative to a signal. A gate terminal 4G is grounded through a capacitor C5 which presents a low impedance relative to a signal.

According to the example of such prior art as shown in FIG. 6, when the temperatures of the FETs 41, 42, 43 rise, the threshold values Vth thereof are lowered respectively so that, even if a DC drain current of the FET 43 is increased (or decreased), a DC drain voltage of the FET 43 is lowered (increased), thereby suppressing the DC drain current from being increased (decreased). As a consequence, the DC drain current is not changed at all, whereby DC drain currents of the FETs 41, 42, i.e., bias drain currents, are not changed. Furthermore, when the FETs 41, 42 and 43 are J-FETs, the diffusion potential φD is about 1.2 V and is sufficiently high as compared with that of the MES-FET. Therefore, tolerance fluctuation widths of the threshold voltages Vth of the FETs 41, 42, 43 are wide and this bias circuit can be operated by a single low voltage power supply.

Incidentally, the power supply +B and the drain terminal 4D may be connected together directly. If the resistor R41 is interposed between the power supply +B and the drain terminal 4D, then a bias stability can be increased.

FIG. 7 shows a relationship between a characteristic of the drain current (mA) versus threshold voltages Vth (V) of the FETs 41, 42 in the examples of the prior art shown in FIGS. 5 and 6 in comparison with that of the example of the prior art shown in FIG. 4. In FIG. 7, a solid line shows a characteristic measured when the resistor R41 in the examples of the prior art shown in FIGS. 5 and 6 is removed. A broken line in FIG. 7 shows a characteristic measured when the above-mentioned resistor R41 is provided. A one-dot chain line in FIG. 7 shows the characteristic measured in the case of the prior art example of FIG. 4.

As described above, the bias stabilizing circuits of the GaAs semiconductor FETs according to the prior-art examples shown in FIGS. 5 and 6 have the advantage such that the bias stability is high, and the tolerance fluctuation width of the threshold voltage Vth is wide and can be driven by the single low voltage power supply.

When the bias stabilizing circuit of the GaAs semiconductor FET according to the prior-art example use the single low voltage power supply of about 3 V, if a fluctuation ratio of the DC drain current is suppressed in a range of from ±10%, then the tolerance fluctuation width of the threshold voltage Vth falls in a range of from ±0.1 to 5 V at best. Therefore, it is impossible to suppress the tolerance fluctuation width of the threshold voltage Vth to that width from an IC manufacturing technology standpoint.

OBJECTS AND SUMMARY OF THE INVENTION

Therefore, it is an object of the present invention to provide an MMIC having a self-bias circuit in which a bias stability is high, a bias capacitor can be removed, and in which the occurrence of a distortion is small.

It is another object of the present invention to provide an MMIC having a self-bias circuit in which an operation margin for a fluctuation of a threshold voltage is large and which can be driven by a single low voltage power supply.

It is a further object of the present invention to provide a monolithic microwave semiconductor integrated circuit apparatus which can generate a bias voltage near a threshold voltage of an FET.

It is yet a further object of the present invention to provide a bias stabilizing circuit for a field effect transistor formed of a compound semiconductor in which a bias stability is high, a tolerance fluctuation width of a threshold voltage is sufficiently wide, and which can be operated by a single low voltage power supply.

According to an aspect of the present invention, there is provided a monolithic microwave semiconductor integrated circuit which includes a bias stabilizing circuit of a current mirror type formed of a bias control transistor formed of an enhancement mode compound semiconductor field effect transistor and a biased transistor formed of an enhancement mode compound semiconductor field effect transistor.

According to a second aspect of the present invention, there is provided a monolithic microwave semiconductor integrated circuit which includes a bias stabilizing circuit of a current mirror type formed of a bias control transistor formed of an enhancement mode junction field effect transistor and a biased transistor formed of an enhancement mode junction field effect transistor.

In accordance with a third aspect of the present invention, there is provided a microwave semiconductor integrated circuit for generating a bias voltage that is applied to an active circuit element. This microwave semiconductor integrated circuit comprises a field effect transistor whose source is grounded and whose gate and drain are connected commonly, a negative element for applying a power source voltage to a gate-drain common connection point of the field effect transistor, and a high impedance element for supplying a potential at the gate-drain common connection point of the field effect transistor to the active circuit element as a bias voltage.

In accordance with a fourth aspect of the present invention, there is provided a bias stabilizing circuit for a field effect transistor formed of a compound semiconductor which is comprised of a bias circuit in which one output electrode of the bipolar transistor which is applied at its base with a bias voltage is connected through a first resistor to a power supply and the other output electrode is grounded through a second resistor, and a field effect transistor formed of a compound semiconductor biased by the bias circuit, wherein one output electrode of the bipolar transistor is connected to one output electrode of the field effect transistor and the other output electrode of the bipolar transistor is connected to the gate of the field effect transistor.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

Embodiments of the present invention will hereinafter be described with reference to the drawings.

Figure 1:
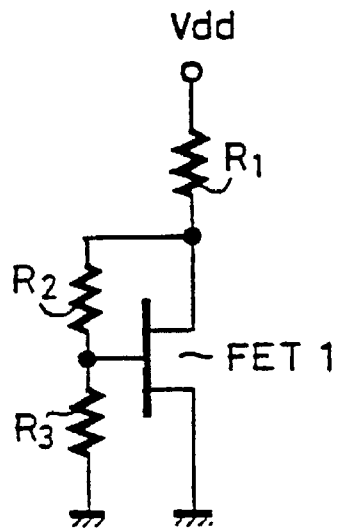
FIG. 1 is a schematic diagram showing an example of an FET bias circuit according to the prior art.
Figure 2:
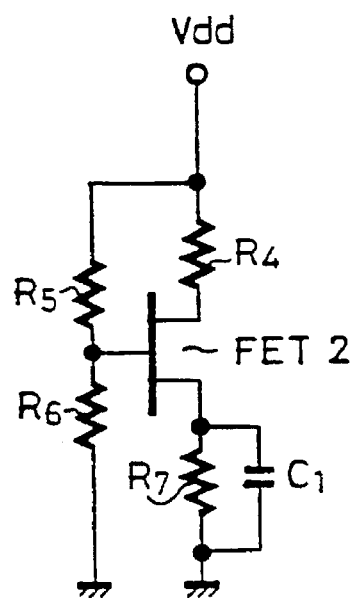
FIG. 2 is a schematic diagram showing another example of the FET bias circuit according to the prior art.
Figure 3:
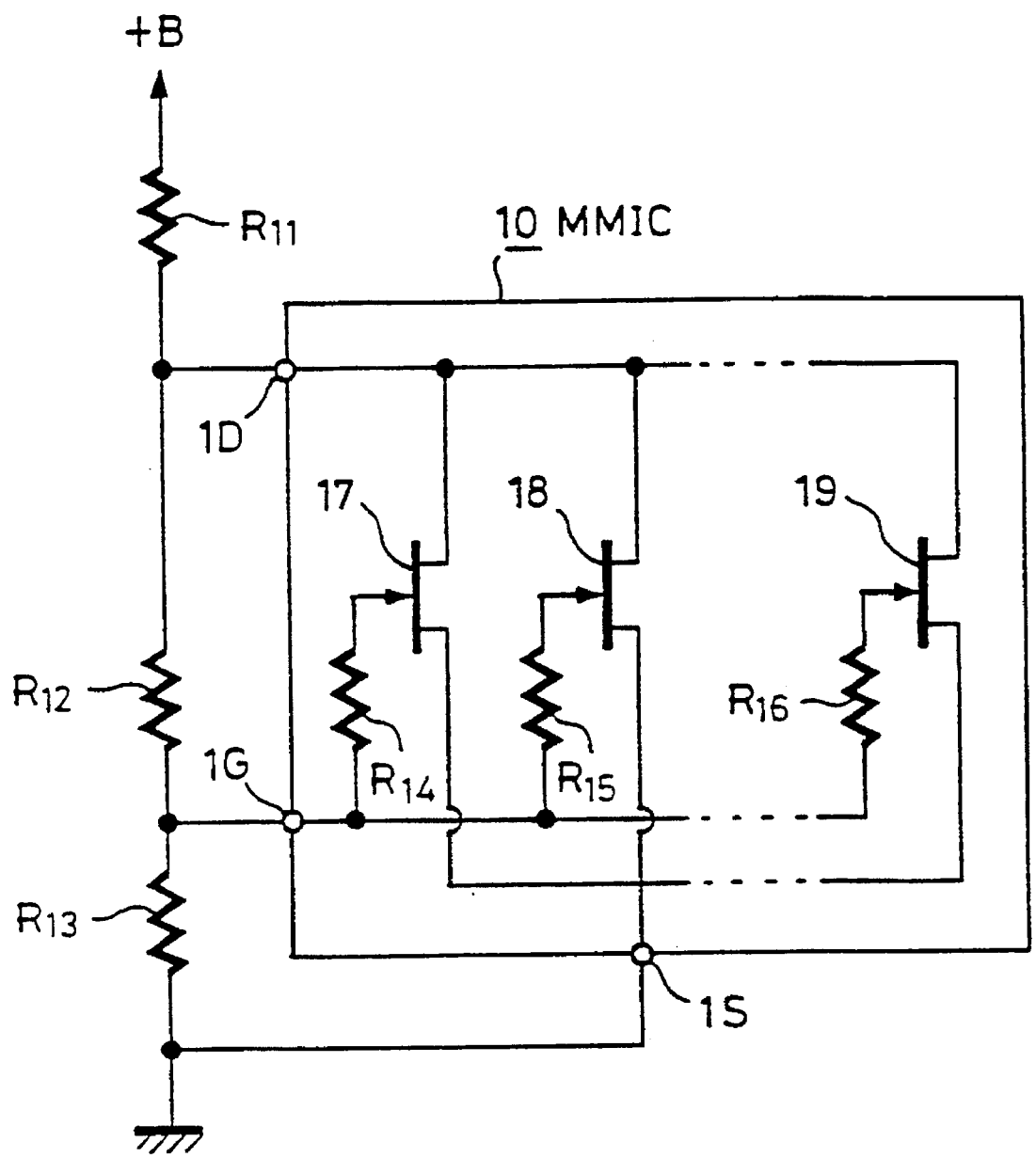
FIGS. 3 to 5 are schematic diagrams showing further examples of the FET bias circuits according to the prior art, respectively.
Figure 4:
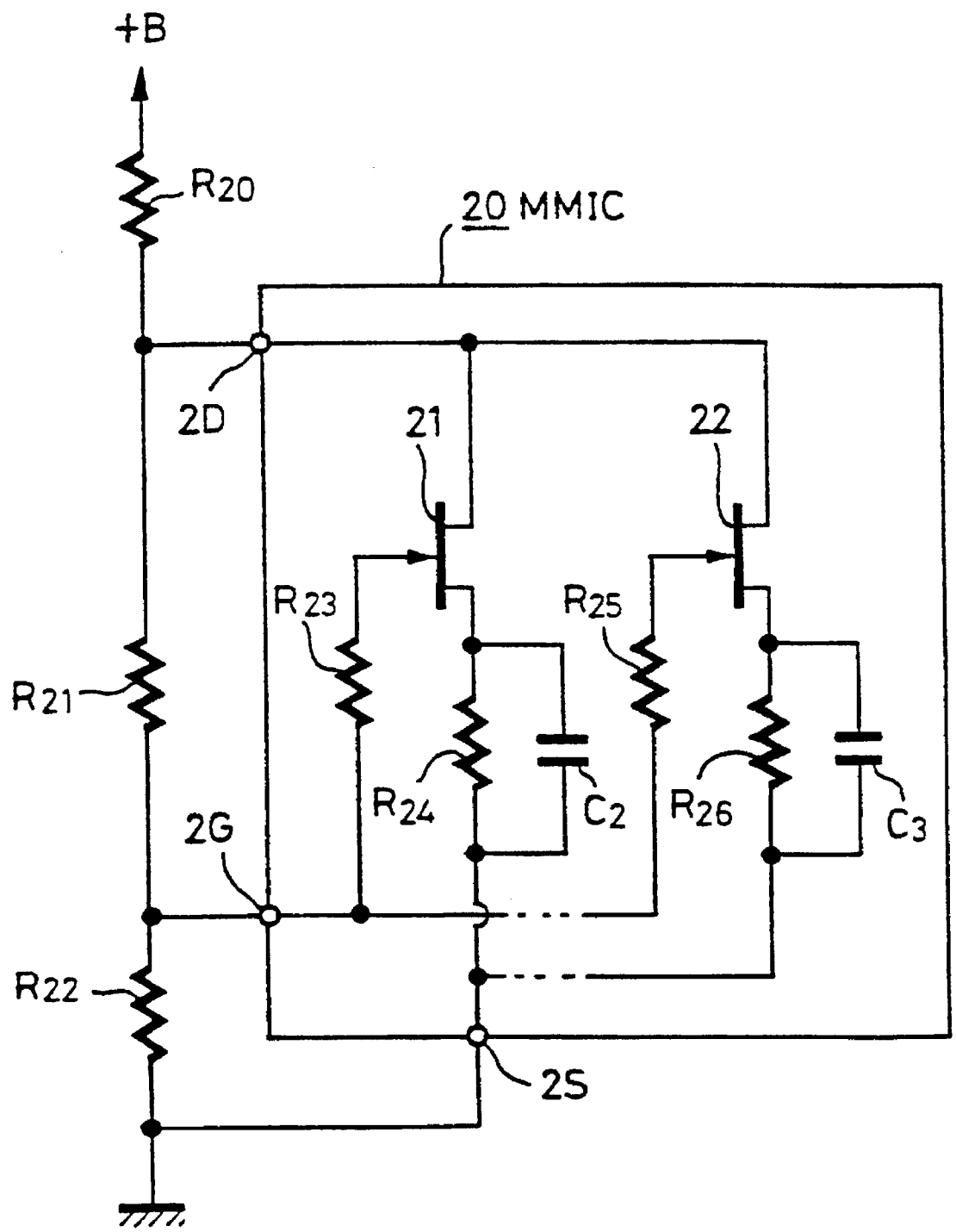
Figure 5:
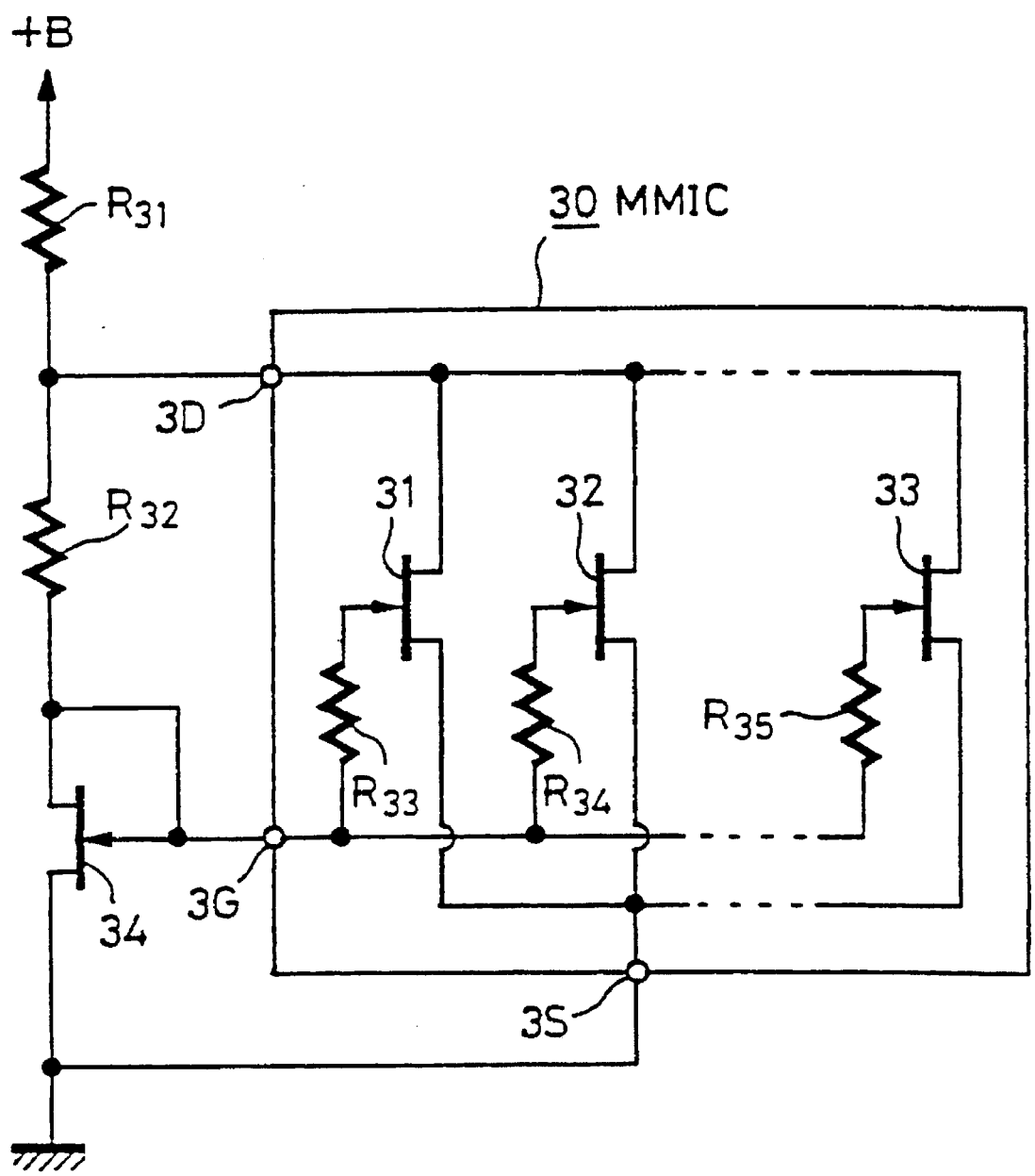
Figure 6:
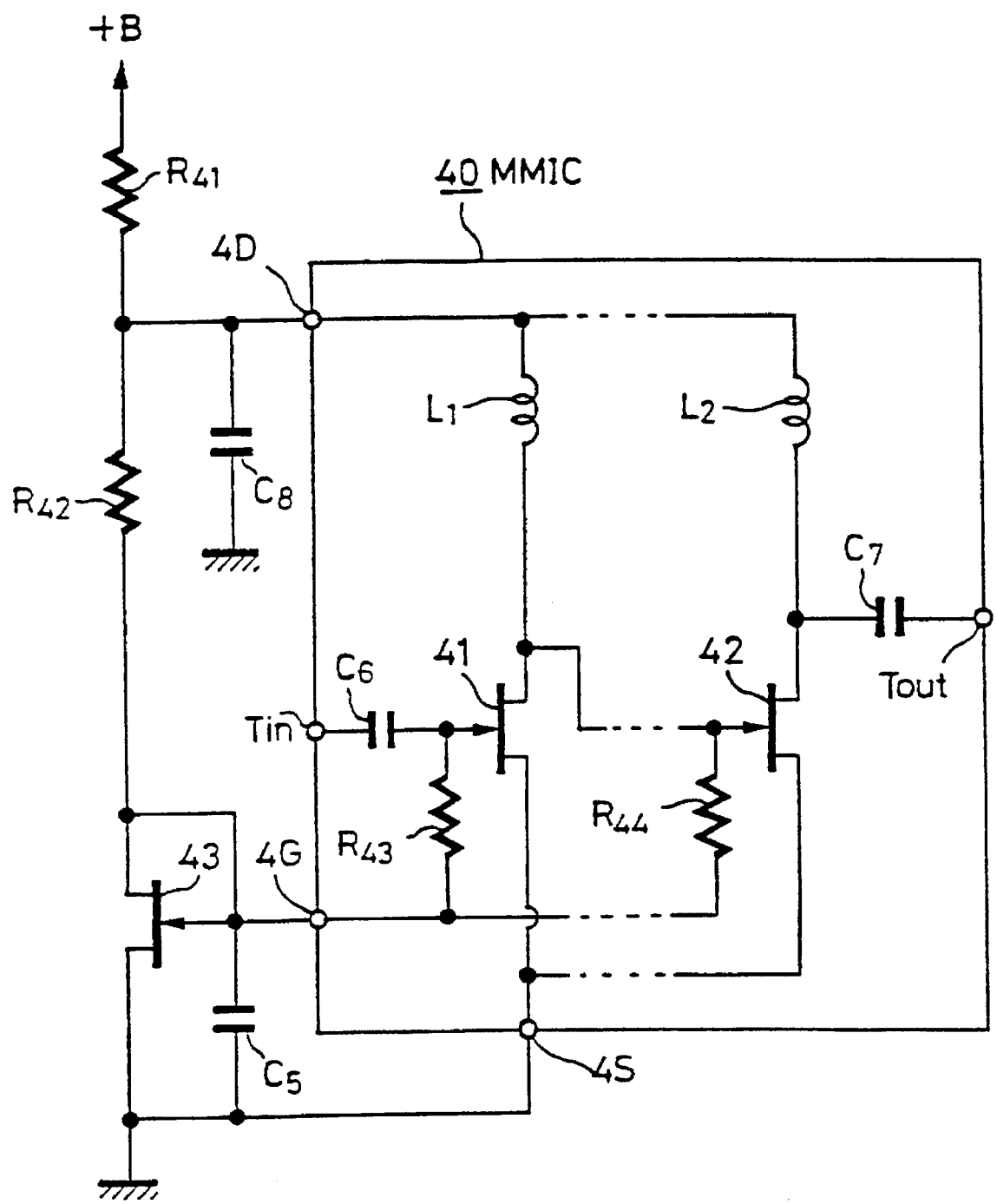
FIG. 6 is a schematic diagram showing an example of the prior-art amplifying circuit using the FET bias circuit shown in FIG. 5.
Figure 7:
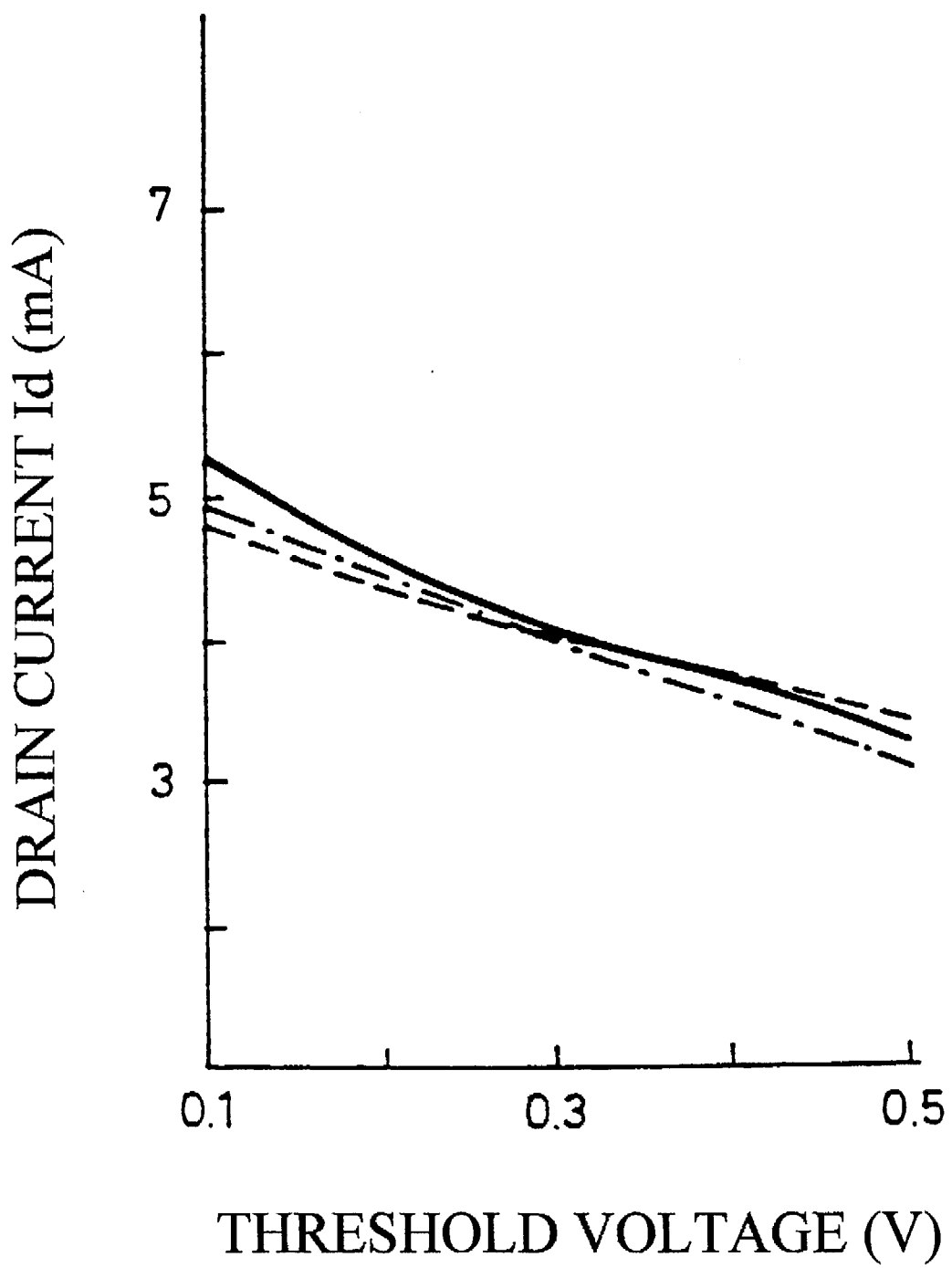
FIG. 7 is a graph showing a relationship between an operation voltage and an operation current of the amplifying circuit shown in FIG. 6.
Figure 8:
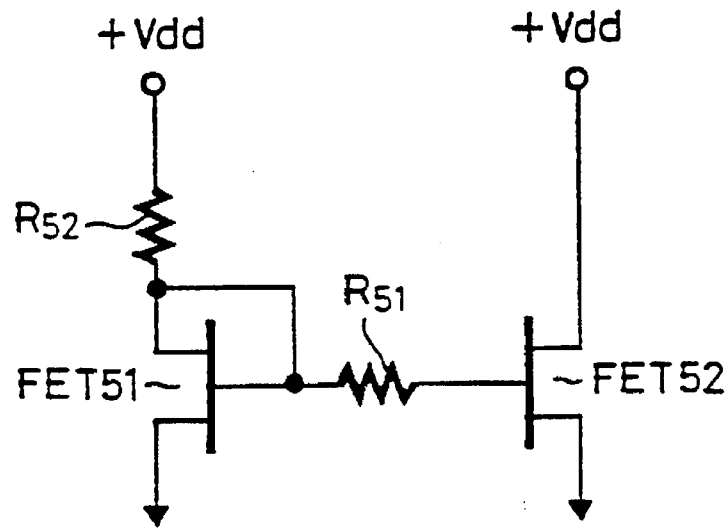
FIG. 8 is a schematic diagram showing a first embodiment of an FET bias circuit according to the present invention.

FIG. 8 shows an equivalent circuit diagram of the first embodiment of the bias circuit of the MMIC according to the present invention. As shown in FIG. 8, the MMIC of the first embodiment includes a current mirror type bias stabilizing circuit formed of a bias control transistor FET 51 and a biased transistor FET 52.

The phrase "bias circuit" as used in this specification should be taken to refer to a circuit that is biased.

In FIG. 8, each of the bias control transistor FET 51 and the biased transistor FET 52 is formed of a semiconductor field effect transistor of an enhancement mode, and more practically, each of them is formed of MESFET or JFET formed of III/V-compound semiconductor. A source portion of the biased transistor FET 52 is grounded directly. Also, the bias control transistor FET 51 is an element used to stabilize the bias voltage. Further, the biased transistor FET 52 is an element that is operated as an amplifier, a mixer or an oscillator in actual practice.

A gate portion of the biased transistor FET 52 and the gate portion of the bias control transistor FET 51 are connected through a first resistor R51. A drain portion of the biased transistor FET 52 is connected to a power supply +Vdd. The source portion of the biased transistor FET 52 is grounded directly as set forth above. A gate portion of the bias control transistor FET 51 is short-circuited to the drain portion of the bias control transistor FET 51. The drain portion of the bias control transistor FET 51 is connected through a second resistor R52 to the power supply +Vdd. The source portion of the bias control transistor FET 51 is grounded as described above.

Figure 9:
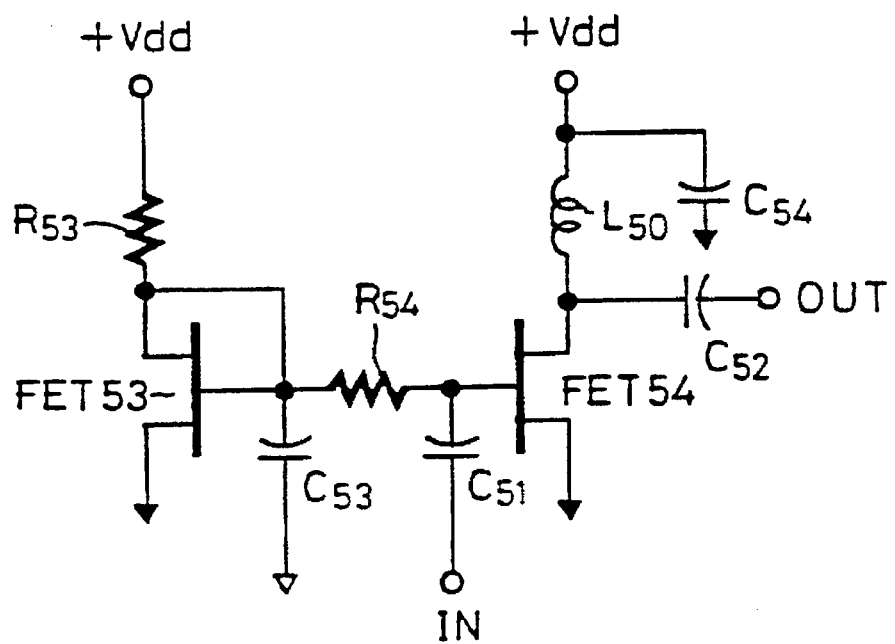
FIG. 9 is a schematic diagram showing a second embodiment of an amplifying circuit using the FET bias circuit shown in FIG. 8.

FIG. 9 shows a circuit arrangement of a second embodiment of the MMIC bias circuit according to the present invention provided when a high frequency characteristic is taken into consideration. As shown in FIG. 9, a signal input terminal IN is provided between a first resistor R54 through a capacitor C51. A signal is input to the biased transistor FET 54 from this signal input terminal IN. A signal output terminal OUT is connected to a drain portion of the biased transistor FET 54 through a capacitor C52, and a signal is output from this signal output terminal OUT.

As shown in FIG. 9, it is preferable that a grounded capacitor C53 is interposed between the first resistor R54 and the gate portion of a bias control transistor FET 53. The first resistor R54 and the capacitor C53 constitute a low-pass filter. It is preferable that this low-pass filter is connected between the input terminal IN and the gate portion of the bias control transistor FET 53. Thus, a high frequency circuit portion formed of the biased transistor FET 54 and the bias circuit portion formed of the bias control transistor FET 53 can be insulated from each other electrically. More specifically, a potential of the gate portion of the bias control transistor FET 53 can be prevented from being changed due to the influence of a signal from the signal input terminal IN. Also, the gate portion of the bias control transistor FET 53 can be prevented from being affected by an extraneous noise. In the microwave band, it is sufficient that a resistance value of the first resistor R54 is selected to be several 10 s of kilo ohms and a capacitance of the capacitor C53 is selected to be several picofarads.

The bias control transistor FET 53 and the biased transistor FET 54 may be connected to a single power supply or a plurality of power supplies including a negative power supply.

Operation of this current mirror type bias stabilizing circuit has already been described and therefore need not be described in detail herein.

Figure 10A:
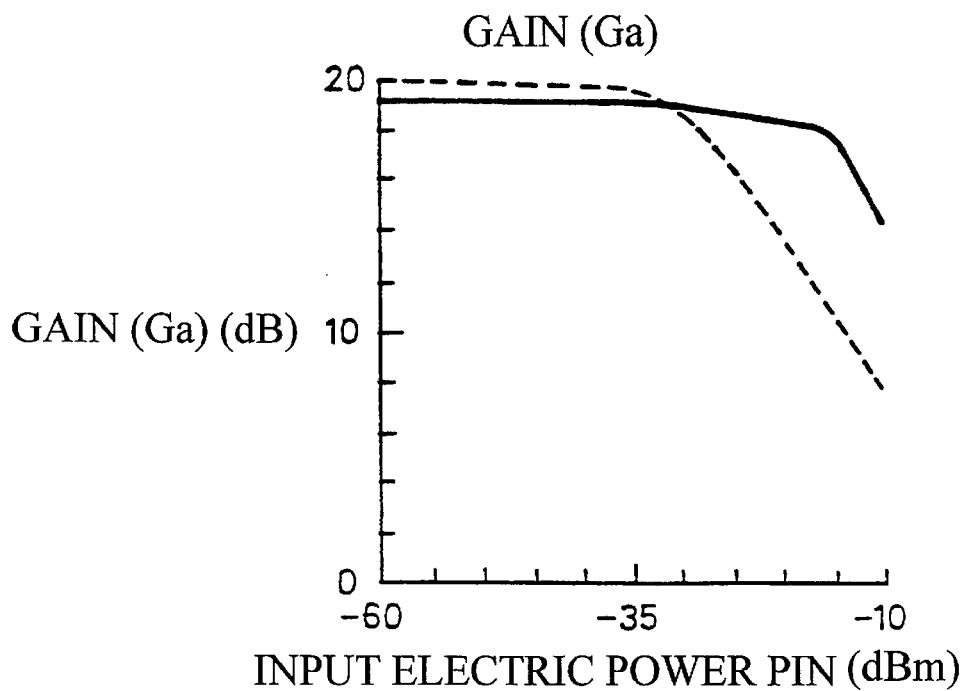
FIGS. 10A and 10B are graphs showing measured results of a gain and a distortion of the amplifying circuit shown in FIG. 9, respectively.
Figure 10B:
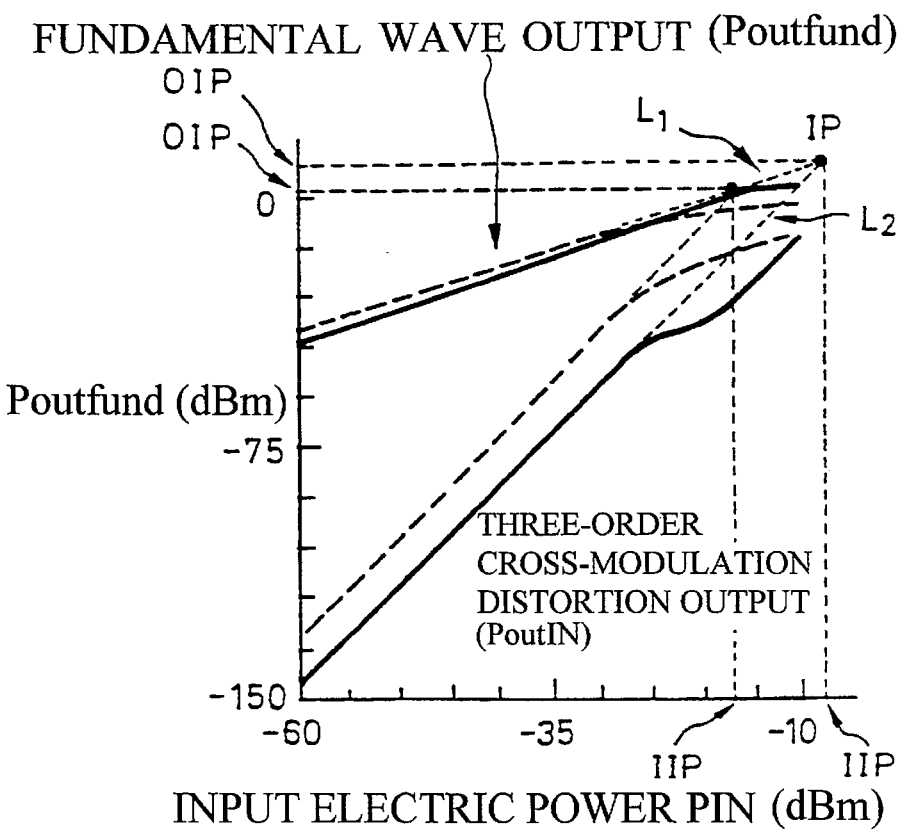

A difference between high frequency characteristics of the MMIC including the current mirror type bias stabilizing circuit of the present invention and the conventional MMIC including the current feedback self-bias system bias stabilizing circuit mainly appears in a distortion characteristic. FIGS. 10A and 10B show simulated results of these high frequency characteristics. Incidentally, a capacity of the bypass capacitor C1 of the conventional MMIC was selected to be 20 pF. Upon simulation, it is assumed that an MMIC is formed of biased transistors of two stages connected in cascade. FIG. 10A shows a gain Ga (output voltage/input voltage) of the 2 GHz band amplifier. FIG. 10B shows simulated results in which a fundamental output Poutfund provided when two close waves are input and a three-order cross modulation distortion output PoutIM are plotted relative to an input electric power Pin, respectively. Further, FIG. 10B shows a value IIP which is an input equivalent to the intercept point IP and a value OIP which is an output equivalent thereto in the respective systems. In FIGS. 10A, 10B, solid lines represent simulated results obtained in the case of the MMIC of the present invention, and broken lines represent simulated results obtained in the case of the conventional MMIC including the bias stabilizing circuit of the current feedback self-bias type.

When a signal having two close frequencies f1 and f2 of the same level (a value of (f1-f2)/f1 is about 0.1%) is input to the MMIC, there are output not only a signal (fundamental wave) having the frequencies f1, f2 but also a signal having secondary harmonic waves 2 f1 and 2 f2. Further, a three-order cross modulation distortion having frequencies (2 f1-f2) or (2 f2-f1) is output. Poutfund depicts an output of the fundamental output having the frequencies f1, f2. Also, PoutIM depicts a three-order cross modulation distortion having frequencies of (2 f1-f2) or (2 f2-f1). When the input voltage Pin is changed, a ratio in which PoutIM is changed is three times the ratio in which Poutfund is changed.

As shown in FIG. 10B, Poutfund and PoutIM are saturated when the input electric power Pin is increased. In an input electric power P in which a linear characteristic is established, a tangent L1 of Poutfund and a tangent L2 of PoutIM are calculated. In this case, a point in which the above-mentioned two tangents L1 and L2 cross each other is referred to as an intercept point IP. IIP represents a value in which the intercept point IP is transformed into input, and OIP represents a value in which the intercept point IP is transformed into output. If the values of IIP and OIP are larger, then the three-order cross modulation distortion becomes smaller.

As is clear from FIGS. 10A and 10B, the MMIC of the present invention and the conventional MMIC are substantially the same with respect to the gain Ga but they have a difference of about 7 dB therebetween with respect to the IIP and OIP which are indexes of distortion characteristic. More specifically, the MMIC of the present invention in which the resistor is not inserted into the source portion of the biased transistor FET 54 has a better distortion characteristic. Results similar to these simulated results were confirmed in the MMIC amplifier that was manufactured in actual practice.

Figure 11:
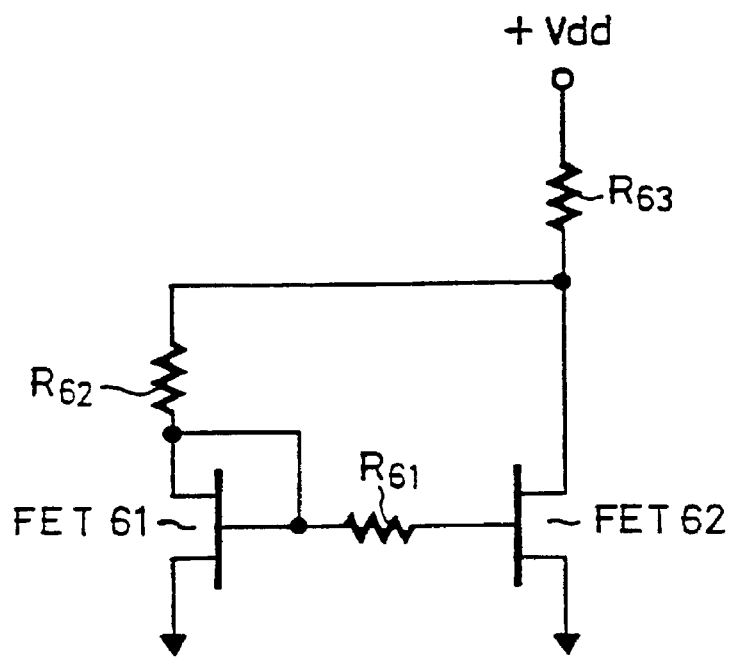
FIG. 11 is a schematic diagram showing a third embodiment of the FET bias circuit according to the present invention.
Figure 12:
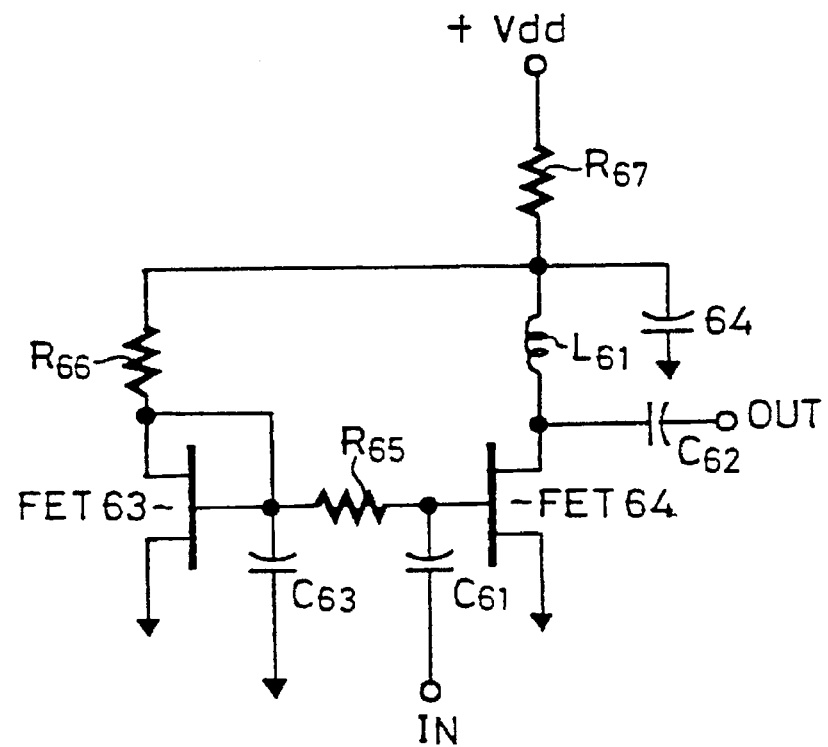
FIG. 12 is a schematic diagram showing a fourth embodiment of an amplifying circuit using the FET bias circuit shown in FIG. 11 according to the present invention.

A third embodiment of the present invention will be described next. As shown in FIG. 11, a drain portion of a biased transistor FET 62 and a second resistor R62 are connected to a power supply +Vdd through a resistor R63, thereby further increasing a stability of the bias stabilizing circuit.

Figure 13:
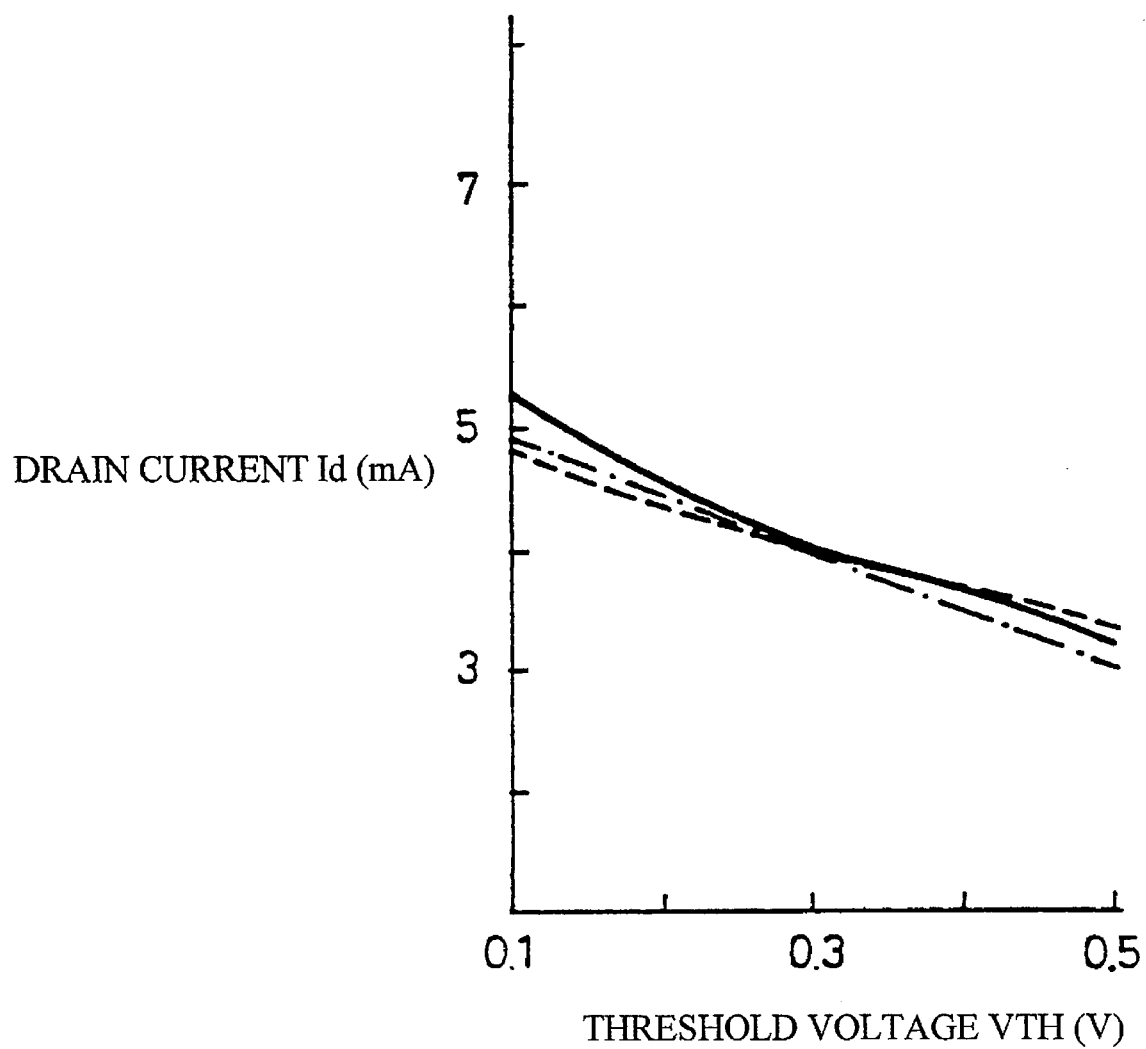
FIG. 13 is a graph showing a relationship between a threshold voltage and a drain current of the amplifying circuit shown in FIG. 12.

FIG. 13 shows a fluctuation of a drain current Id2 of the biased transistor FET 62 against the fluctuation of a threshold voltage VTH2, i.e., bias stability. A solid line in FIG. 13 shows a measured fluctuation obtained by the MMIC having the bias stabilizing circuit according to the first embodiment of the present invention, and a dashed line in FIG. 13 shows a measured fluctuation obtained by the MMIC having the bias stabilizing circuit according to the present invention shown in FIG. 11 (i.e., the resistor R63 is inserted). Also, a one-dot chain line in FIG. 13 shows a measured fluctuation obtained by the MMIC using the conventional current feedback self-bias type. Study of FIG. 13 reveals that the MMIC according to the present invention has a bias stability substantially the same as that of the conventional current feedback self-bias type. In addition, in the third embodiment in which the resistor R63 is inserted in the current mirror type bias stabilizing circuit is increased in bias stability as compared with the embodiment of the first embodiment.

A fourth embodiment of the present invention will be described below. A circuit arrangement in which the DC equivalent circuit and the high frequency characteristic of the bias circuit of the MMIC according to the fourth embodiment of the present invention can be made substantially similar to those of the first or third embodiment. More specifically, the MMIC according to the fourth embodiment of the present invention also includes a bias stabilizing circuit of a current mirror type formed of a bias control transistor FET 63 and a biased transistor FET 64, similarly to the first or third embodiment.

The fourth embodiment is different from the first and third embodiments in that the bias control transistor FET 63 and the biased transistor FET 64 must be formed of enhancement mode type junction field effect transistors (JFETs). It is preferable that the JFET is formed of III/V-compound semiconductor such as GaAs or the like. Further, a drain portion of the bias control transistor FET 63 is connected through a second resistor R66 to a power supply (single power supply) to which a drain portion of the biased transistor FET 64 is connected.

More specifically, the gate portion of the biased transistor FET 64 is connected through a first resistor R65 to the gate portion of the bias control transistor FET 63. The drain portion of the biased transistor FET 64 is connected to the power supply. A source portion of the biased transistor FET 64 is grounded directly. A gate portion of the bias control transistor FET 63 is short-circuited to the drain portion of the bias control transistor FET 63. The drain portion of the bias control transistor FET 63 is connected to one end of a second resistor R66, and the other end of the second resistor R66 is connected to the power supply to which the drain portion of the biased transistor FET 64 is connected. A source portion of the bias control transistor FET 63 is grounded.

As earlier noted in the MESFET of the enhancement mode type, the diffusion potential $\phi D$ is about 0.6 V at most and the threshold voltage VTH cannot be increased. Therefore, when the MESFET is used, it is frequently observed that the operation margin for the fluctuation of the threshold voltage VTH is small, requiring the negative power supply. As a consequence, the MESFET cannot be driven by a single power supply of low voltage substantially. If the MESFET is operated by a single power supply, a resistor must be connected to the source portion of the biased transistor FET 64 to supply an offset voltage. In this case, there occurs the problem that had been described in connection with the current feedback self-bias system.

However, the diffusion potential $\phi D$ of the JFET is about 1.2 V and is sufficiently high as compared with that of the MESFET. Therefore, the operation margin for the fluctuations (fluctuations of about ±0.2 V) of the threshold voltages VTH1 and VTH2 are large and the negative power supply is not necessary. Thus, the MMIC can be operated with the single low voltage power supply.

Operation of the bias stabilizing circuit of the current mirror type according to the fourth embodiment of the present invention is the same as described herein before and therefore need not be described in detail.

A fifth embodiment of the present invention is a modification of the fourth embodiment. While the resistor R66 is connected between the drain portion of the bias control transistor FET 63 and the power supply in the fourth embodiment, according to the fifth embodiment, a second bias control transistor FET 73 formed of an enhancement mode type junction field effect transistor is connected instead of the resistor R66 as shown in the DC equivalent circuit of FIG. 14 and in consideration of a high frequency characteristic shown in FIG. 15.

To be more concrete, a gate portion of a biased transistor FET 72 is connected through a first resistor R71 to a gate portion of the bias control transistor FET 71, and a drain portion of the biased transistor FET 72 is connected to the power supply and its source portion is grounded directly. A gate portion of the bias control transistor FET 71 is short-circuited to the drain portion of the bias control transistor FET 71. The drain portion of the bias control transistor FET 71 is connected to a source portion of a second bias control FET 73, and the source portion of the bias control transistor FET 71 is grounded. A gate portion of the second bias control transistor FET 73 is connected to the drain portion of the biased transistor FET 72 by way of the second resistor R72. A drain portion of the second bias control transistor FET 73 is connected to the power supply to which the drain portion of the biased transistor FET 72 is connected.

Figure 14:
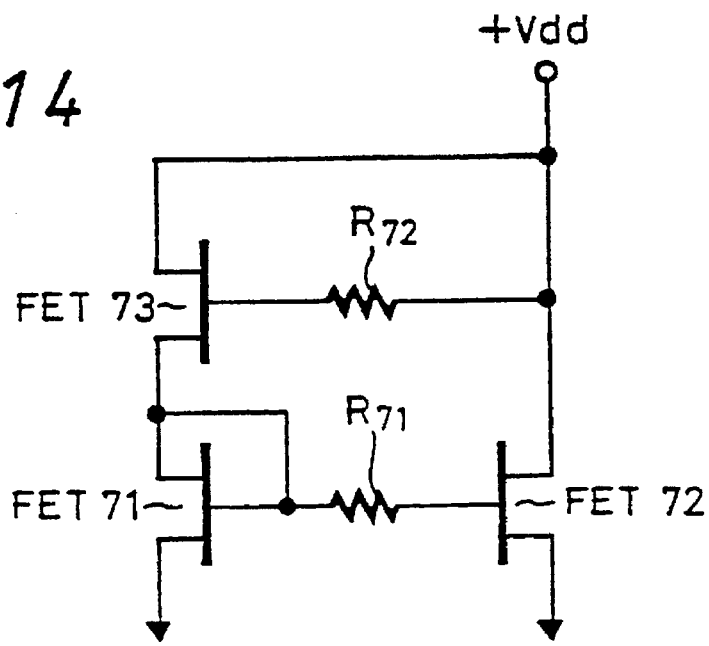
FIGS. 14 and 15 are schematic diagrams showing a fifth embodiment of the FET bias circuit according to the present invention, and an amplifying circuit using such an FET bias circuit, respectively.
Figure 15:
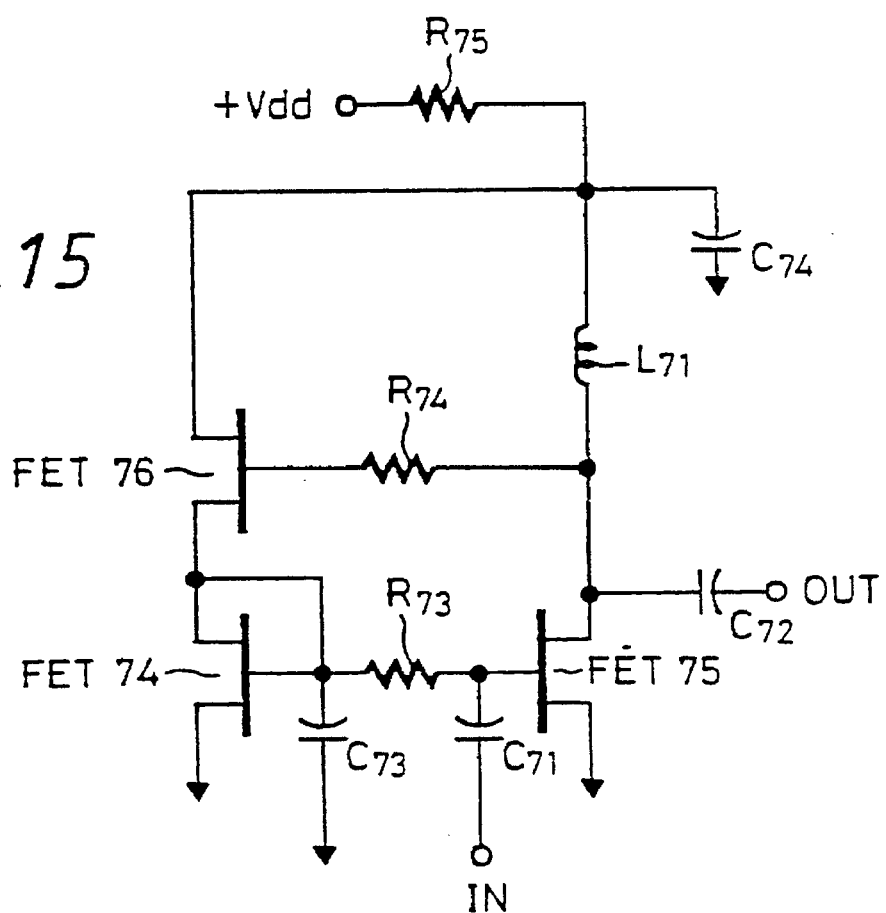

Operation of the bias stabilizing circuit of this embodiment will be described in association with the equivalent circuit of the bias stabilizing circuit of the current mirror type shown in FIG. 14 and with reference to FIG. 15. When temperatures of a bias control transistor FET 74 and a biased transistor FET 75 rise, the threshold voltages VTH1 and VTH2 of the bias control transistor FET 74 and the biased transistor FET 75 are lowered so that drain currents Id1, Id2 flowing through the bias control transistor FET 74 and the biased transistor FET 75 are increased. As a consequence, a voltage drop across a second resistor R74 becomes large and the gate voltage of a second bias control transistor FET 76 is lowered, thereby a resistance value of the second bias control transistor FET 76 being increased. Consequently, a potential Vds1 between the drain portion and the source portion of the bias control transistor FET 74 is lowered. Since the drain portion and the gate portion of the bias control transistor FET 74 are short-circuited as described above, a potential Vgs1 between the gate portion and the source portion of the bias control transistor FET 74 is lowered as the potential Vds1 is lowered. As a consequence, the feedback is effected so as to decrease the drain current Id1 flowing the bias circuit, thereby suppressing the fluctuation of the drain current Id1.

The threshold voltage VTH1 of the bias control transistor FET 74 and the threshold voltage VTH2 of the biased transistor FET 75 can be regarded as being substantially the same. Since the gate portion of the bias control transistor FET 74 and the gate portion of the biased transistor FET 75 are connected together via a first resistor R73, the gate portion of the biased transistor FET 75 is applied with a bias voltage that depends on the change of the potential Vgs1 of the bias transistor FET 74. Therefore, the drain current Id2 flowing the biased transistor FET 75 is kept substantially constant regardless of the fluctuation of the threshold voltage VTH2.

With the above-mentioned arrangement, the bias can be stabilized more as compared with the fourth embodiment.

While the preferred embodiments have been described so far, the present invention is not limited to those embodiments. In the practical circuit arrangement, resistors must be inserted into a variety of positions of the circuit in order to adjust the voltage. Also, in order to cut off the high frequency, capacitors must be inserted into various positions of the circuit, which are not shown in the figures.

Since the MMIC according to the first and second modes of the present invention includes the bias stabilizing circuit of the current mirror type, the resistor need not be connected to the source portion of the biased transistor in order to stabilize the bias. Therefore, the bypass capacitor need not be provided and in addition, the distortion can be reduced, the output dynamic range can be widened, and the low power consumption can be achieved. Further, a bias stability substantially the same as that provided by the current feedback self-bias type can be obtained, and the bias need not be adjusted.

A sixth embodiment of the present invention will hereinafter be described with reference to the drawings.

Figure 16:
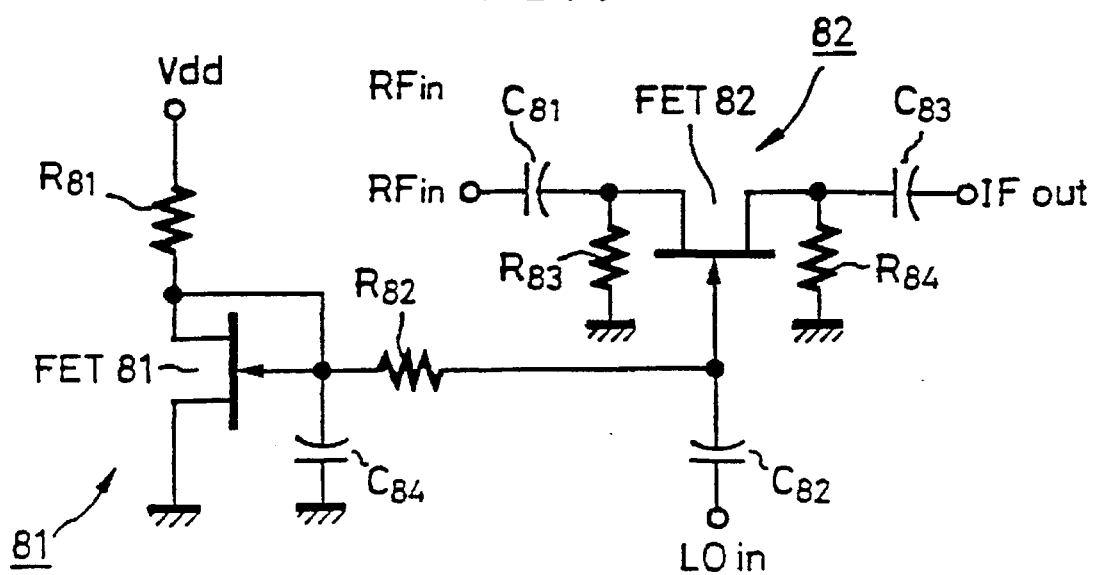
FIG. 16 is a schematic diagram showing a sixth embodiment of the amplifying circuit according to the present invention.

FIG. 16 is a diagram showing a circuit arrangement of the sixth embodiment of the present invention that is applied to an example of a mixer circuit 82.

As shown in FIG. 16, a bias circuit 81 that generates a bias voltage is formed by using an enhancement mode GaAs FET 81. A source of the FET 81 is grounded, and the gate and the drain thereof are commonly coupled. A capacitor C84 is connected between the gate of the FET 81 and the ground. A common connection point between the gate and the drain of the FET 81 is applied with a power supply voltage Vdd through a load resistor R81.

A potential at the gate-drain common connection point of the FET 81 is supplied to an FET 82 which is an active circuit element that constructs a mixer circuit 82 through a resistor R82 serving as a high impedance element as a gate bias voltage $V_{gg}$.

In the mixer circuit 82, an RF signal is input through a capacitor C81 to the drain (or source) of an FET 82. The gate bias voltage $V_{gg}$ supplied from the bias circuit 81 is supplied to the gate of the FET 82. Also, a local oscillation signal (LO signal) is input to the gate of the FET 82 through a capacitor C82. A drain and a source of the FET 82 are respectively grounded via resistors R83 and R84.

An IF (intermediate frequency) signal that results from mixing the RF signal and the local oscillation signal by the FET 82 is output from the source (or drain) of the FET 82 through a capacitor C83.

Incidentally, the local oscillation signal applied to the gate of the FET 82 is cut off by a low-pass filter formed of a resistor R82 and the capacitor C84 so that the local oscillation signal can be prevented from affecting the bias circuit 81.

Figure 17:
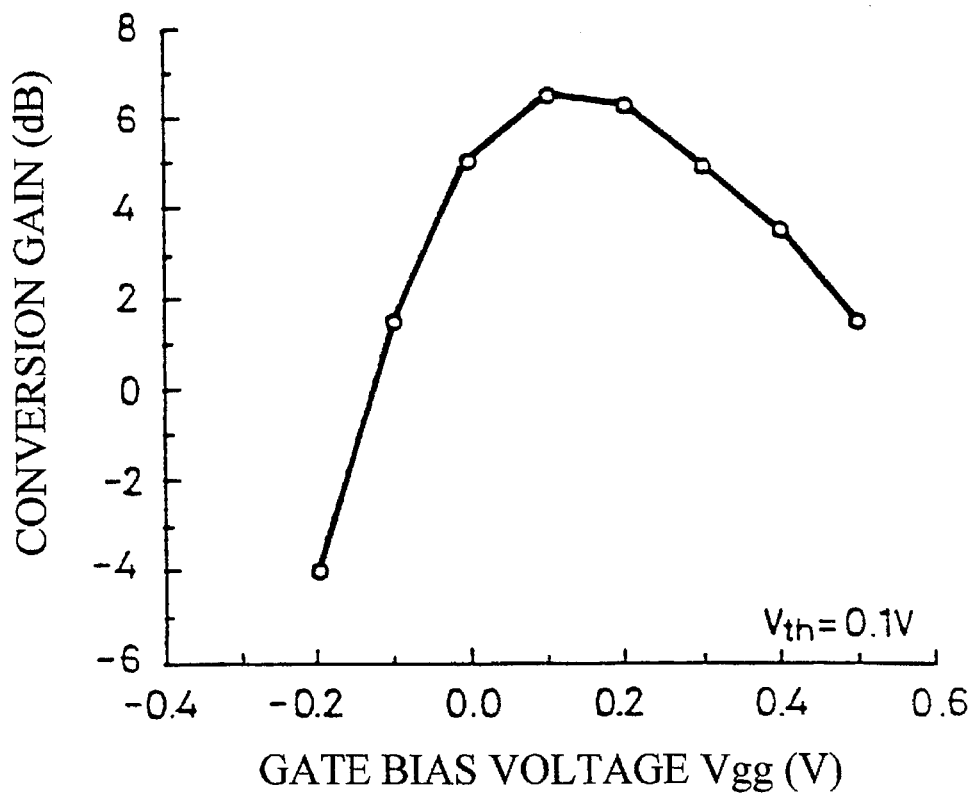
FIGS. 17, 18 and 19 are respectively graphs showing a relationship among a gate bias voltage, a conversion gain, a drain current and a threshold voltage of the amplifying circuit shown in FIG. 16.

As is clear from a characteristic diagram of FIG. 17, in the mixer circuit 82 thus arranged, the mixer conversion gain considerably depends upon the gate bias voltage $V_{gg}$ and a voltage that can provide a maximum conversion gain is near the threshold voltage Vth.

A gate bias voltage dependence of conversion gain of an evaluation sample whose threshold voltage Vth is about 0.1 V was measured.

Since the bias circuit 81 and the mixer circuit 82 are formed of integrated circuits, although the threshold voltages Vth of the FETs 81, 82 are fluctuated with the process, relative values thereof are not fluctuated and can be regarded as substantially the same.

In order to approximate the gate bias voltage $V_{gg}$ of the FET 82 to the threshold voltage Vth such that a maximum gain of the mixer circuit 82 is obtained, in the bias circuit 81, the on-resistance value Ron of the FET 81 must be reduced sufficiently.

As an example of achieving this object, it is sufficient that a gate width wg of the FET 81 is increased sufficiently.

Figure 18:
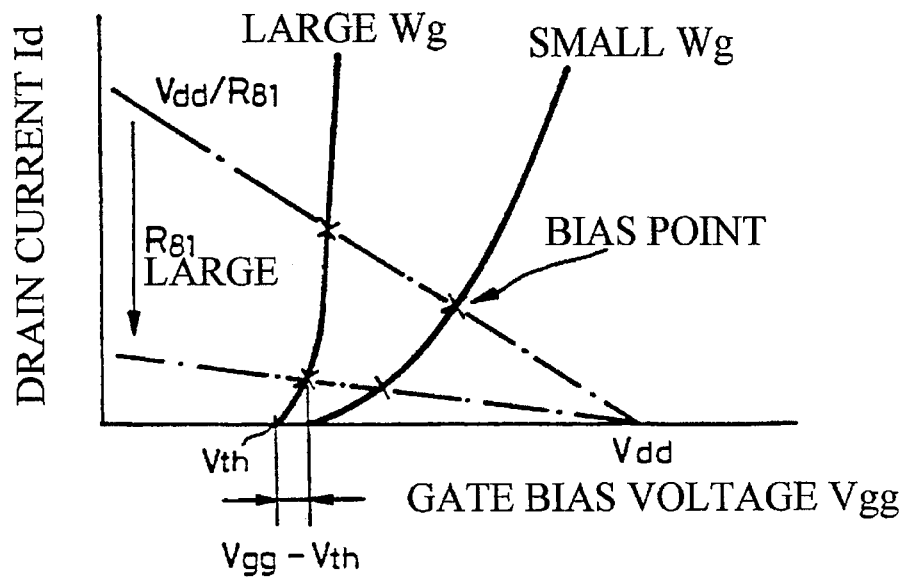

More specifically, in a characteristic diagram of FIG. 18, as the gate width wg of the FET 81 is increased, a curve of $V_{gg}$-$I_g$ (drain current) shown by a solid curve rises. Also, as the load resistor R81 is increased, an inclination of a straight line of Vdd/R81 shown by a one-dot chain line becomes gentle.

In this characteristic, a crossing point (Mark x in FIG. 18) between the $V_{gg}$-$I_g$ curve and the $V_{dd}$/R81 straight line represents a bias points (gate bias voltage $V_{gg}$). When the gate width wg of the FET 81 is large and the load resistor R81 is large, the gate bias voltage $V_{gg}$ approaches the threshold voltage Vth.

Figure 19:
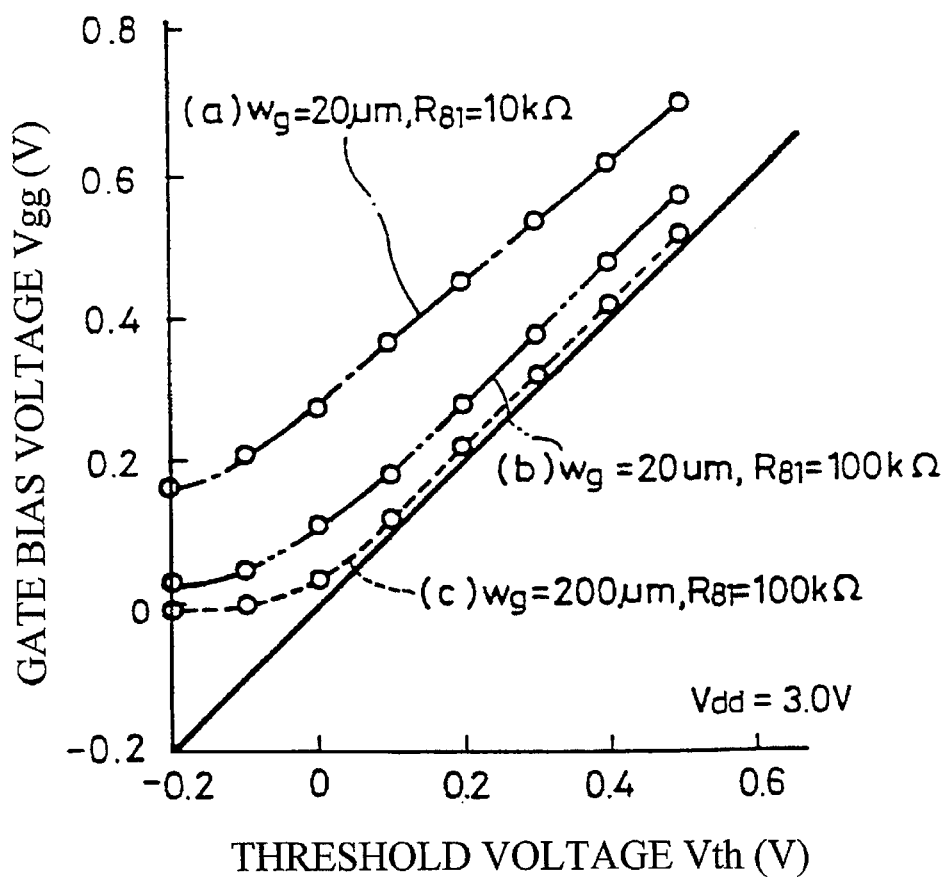

FIG. 19 shows a dependence characteristic of the threshold voltage Vth of the gate bias voltage $V_{gg}$ relative to the gate width wg and the load resistor R81 obtained when the power supply voltage $V_{dd}$ is set to 3 V, for example.

In this characteristic graph of FIG. 19, a one-dot chain line curve (a) represents a characteristic obtained when wg=20

μm and R81=10 KΩ. A two-dot chain line curve (b) represents a characteristic obtained when wg=20 μm and R81=100 KΩ. A broken line curve (c) represents a characteristic obtained when wg=200 μm and R81=100 KΩ. Study of FIG. 19 reveals that, as the gate width wg and the load resistor are both large, the gate bias voltage $V_{gg}$ approaches the threshold voltage Vth inasmuch as the threshold voltage Vth that is in the enhancement mode falls within a positive, range.

Figure 20:
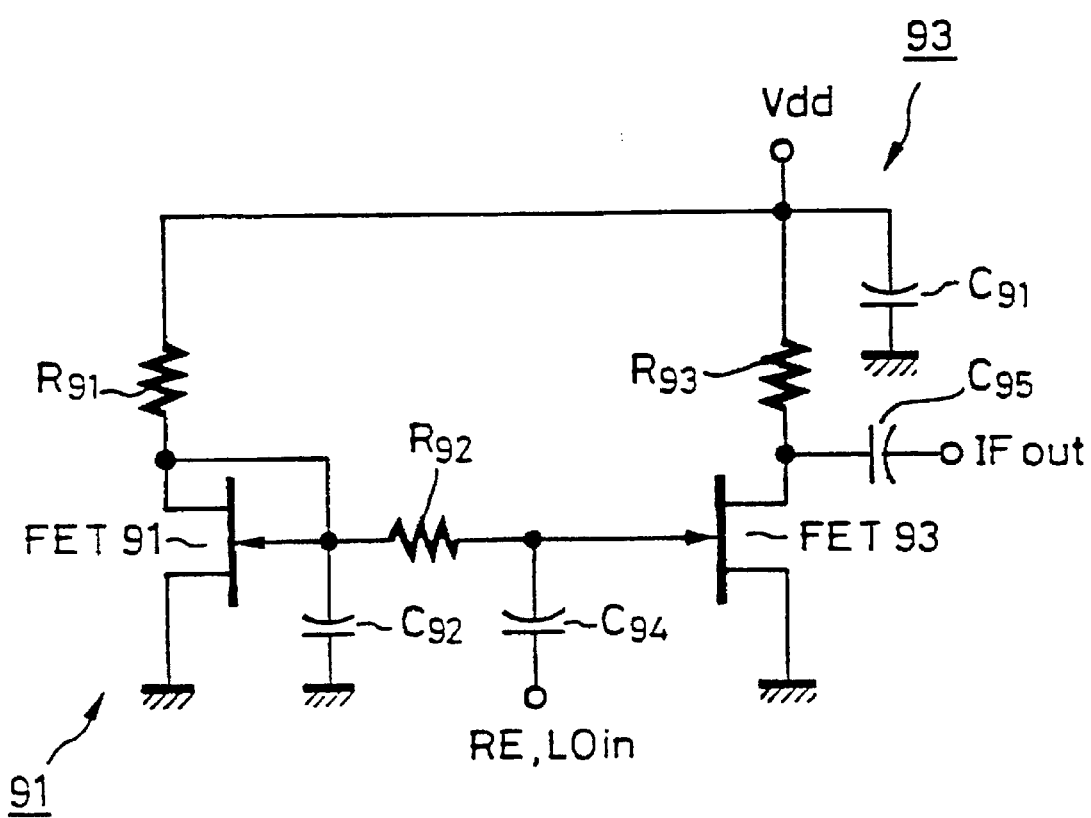
FIG. 20 is a schematic diagram showing a seventh embodiment of a mixer circuit according to the present invention.

FIG. 20 shows a mixer circuit 93 which is a seventh embodiment of the present invention.

In the mixer circuit 93 according to this embodiment, the RF signal and the local oscillation signal are both supplied through a capacitor C94 to the gate of an FET 93. A source of the FET 93 is grounded and the drain thereof is applied with the power supply voltage $V_{dd}$ through a resistor R93.

Then, an IF signal that results from mixing the RF signal and the local oscillation signal is output from the drain the FET 93 through a capacitor C95.

A bias circuit 91 is constructed in exactly the same manner as that in the aforesaid embodiment. Accordingly, by setting the gate width wg of an FET 91 and a load resistor R91 to be sufficiently large, a voltage that is close to the threshold voltage Vth can be set as the gate bias voltage $V_{gg}$ of FET 93 of the mixer circuit 93 similarly to the above-mentioned embodiments.

While in the above embodiments the bias voltage generated in the bias circuit is applied to the mixer circuit as described above, the present invention is not limited thereto and can be applied to the whole of circuits that require the gate bias voltage near the threshold voltage Vth in the microwave semiconductor device using the enhancement mode GaAs FET.

As described above, according to the present invention, since there is used the FET whose source is grounded and whose gate and source are connected commonly, the power supply voltage is applied through the load element to a common connection point of the gate and the drain of this FET, and the potential at this common connection point is supplied to the active circuit element through a high impedance element as the bias voltage, there can be generated a bias voltage that is close to the threshold voltage Vth of FET by sufficiently increasing the gate width of the FET and the load resistor.

An eighth embodiment of the present invention will be described below.

Figure 21:
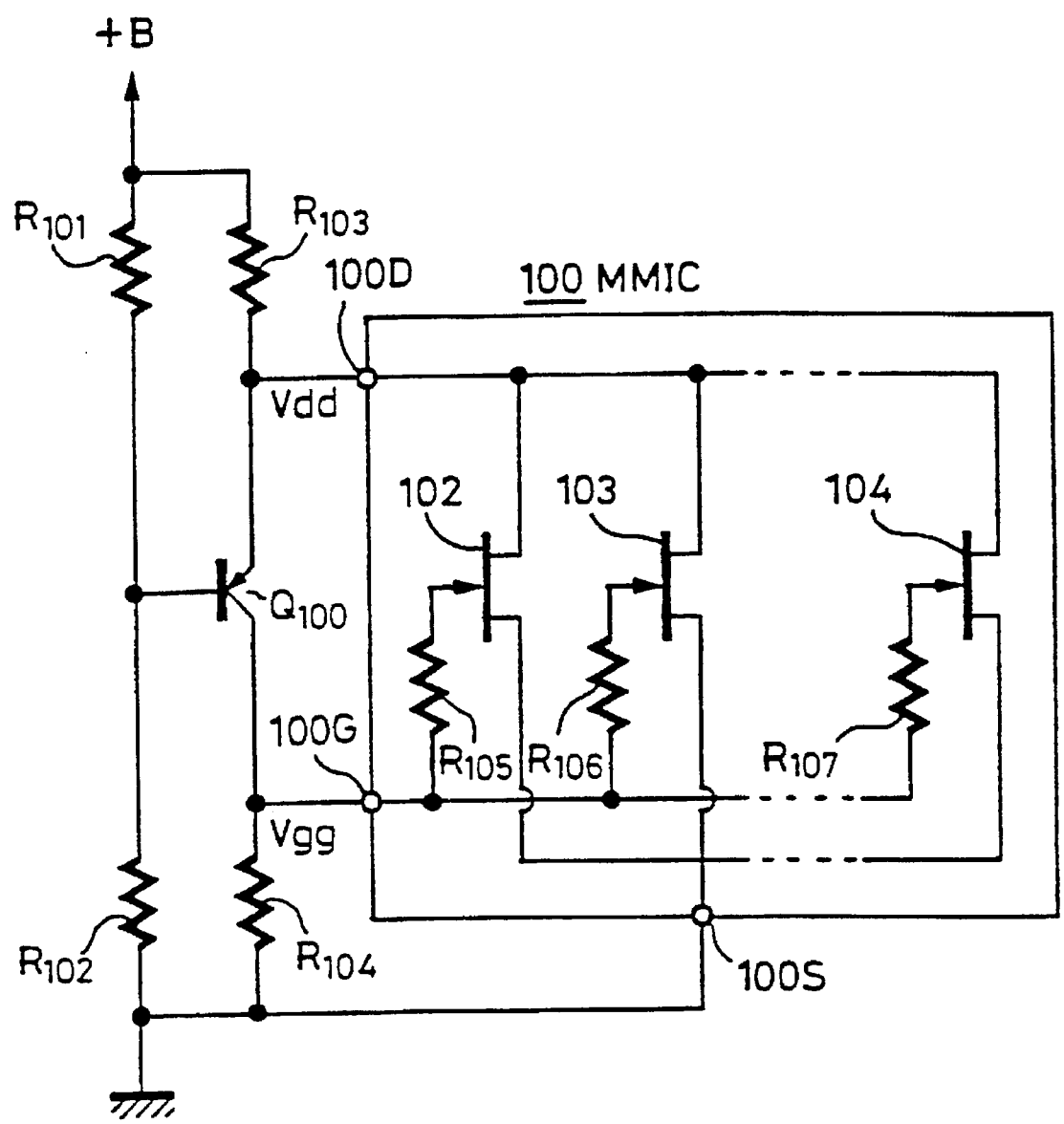
FIG. 21 is a schematic diagram showing an eighth embodiment of the FET bias circuit according to the present invention.

A circuit configuration of the eighth embodiment of the present invention will be described below with reference to FIG. 21. As shown in FIG. 21, an MMIC 100 is formed of a plurality of FETs (N-channel FETs in this embodiment) 102, 103, . . . 104 whose drains and sources are each connected in parallel from a DC standpoint. The drains of the respective FETs 102, 103, . . . 104 are commonly connected to lead out a drain terminal 100D, and the sources thereof are commonly connected to lead out a source terminal 100S. The gates thereof are commonly connected through gate resistors 105, 106, . . . 107 to lead out a gate terminal 100G. Incidentally, the FETs 102, 103, . . . 104 are each formed of enhancement mode type J-FETs.

The bias circuit will be described next. As shown in FIG. 21, there is provided a PNP-type bipolar transistor Q100. A series circuit of resistors R101 and R102 is connected between the power supply +B and the ground. A junction between the resistors R101 and R102 is connected to the base of the transistor Q100, whereby a fixed bias voltage is applied to the base thereof. The emitter of the transistor Q100 is connected through a resistor R103 to the power supply +B, and the collector thereof is grounded through a resistor R104. The emitter of the transistor Q100 is connected to the drain terminal 100D, and the collector thereof is connected to the gate terminal 100G. The source terminal 100S is grounded.

Figure 22:
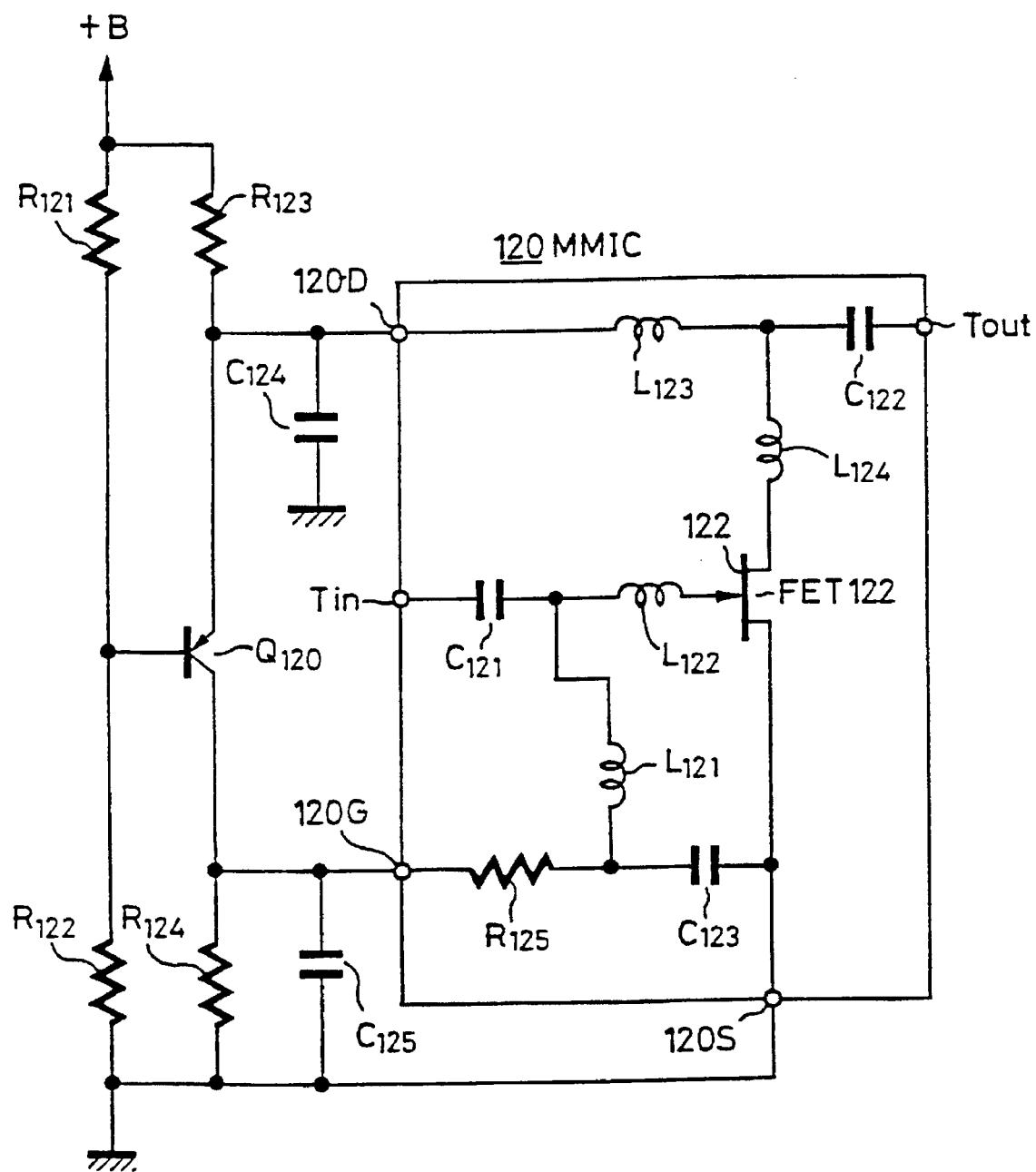
FIG. 22 is a schematic diagram showing a ninth embodiment of the amplifying circuit using the bias circuit shown in FIG. 21 according to the present invention.

FIG. 22 shows a ninth embodiment of the present invention. As shown in FIG. 22, there is provided a signal input terminal Tin which is connected through a matching circuit formed of a capacitor C121 and coils (inductances) L121, L122 to the gate of an FET 122. This matching circuit causes an input impedance to become 50 Ω as seen from the input terminal Tin. The input terminal Tin is sequentially connected through the capacitor C121 and the coil L122 to the gate of the FET 122. A junction between the capacitor C121 and coil L122 is connected to one end of the coil L121, and the other end thereof is grounded through a capacitor C123 which presents a low impedance relative to a signal. A gate terminal 120G is grounded through a capacitor C125 that presents a low impedance relative to the signal. A drain of the FET 122 is connected to a drain terminal 120D through a series circuit of coils (inductances) L123, L124. A junction between the coils L123 and L124 is connected through a capacitor C122 to a signal output terminal Tout. The coils L123, L124 and the capacitor C122 constitute a matching circuit which makes an output impedance to be 50 Ω as seen from the signal output terminal Tout.

A mechanism of the bias circuit (bias stabilizing circuit) according to the ninth embodiment of the present invention will be described below. A collector current $I_c$ of the bipolar transistor Q120 is expressed as;

$$I_c=[\{R121/(R121+R122)V^+-V_{be}\}-R_eI_{dd}]/\{R123+R121 \cdot R122/(R121+R122)/h_{fe}\} \quad (1)$$

In the equation (1), R121 and R122 represent resistance values of the resistors R121, R122, $V^+$ represents the voltage of the power supply +B, $V_{be}$ represents the base-emitter voltage of the transistor Q120, R123 represents the resistance value of the resistor R123, $I_{dd}$ represents a total sum of drain currents flowing through the drain of each of the FETs 122 from the drain terminal 120D, and $h_{fe}$ represents an emitter ground current amplification factor of the transistor Q120. Incidentally, a current that flows from the gate terminal 120G to the gate of the FET 122 is very small and therefore can be neglected.

A DC voltage $V_{gg}$ at the gate terminal is expressed by the following equation:

$$V_{gg}=R124I_c \quad (2)$$

From the above-mentioned equations (1) and (2), the total sum of the DC drain currents that flow from the drain terminal 120D to the drain of the FET 122 is expressed by the following equation:

$$I_{dd}=-aV_{gg}+b \quad (3)$$

The coefficients a and b are expressed by the following equations:

$$a=\{R123+R121 \cdot R122/(R121+R122)/h_{fe}\}/R124 \cdot R123 \quad (4)$$

$$b=\{R121 \cdot V^+/(R121+R122)-V_{be}\}/R123 \quad (5)$$

Incidentally, a range in which the above-mentioned equation (3) is established is expressed by the following equation:

$$0<V_{gg}<V_{bi} \quad (6)$$

In the equation (6), $V_{bi}$ represents a diffusion potential φD of the FET 122.

Also, $I_{dd}$-$V_{gg}$ characteristic is expressed by the following approximation equation:

$$I_{dd}=B(V_{gg}-Vth)^2(V_{gg}\pm Vth) \quad (7)$$

where Vth is the threshold voltage of the FET 122.

Figure 23:
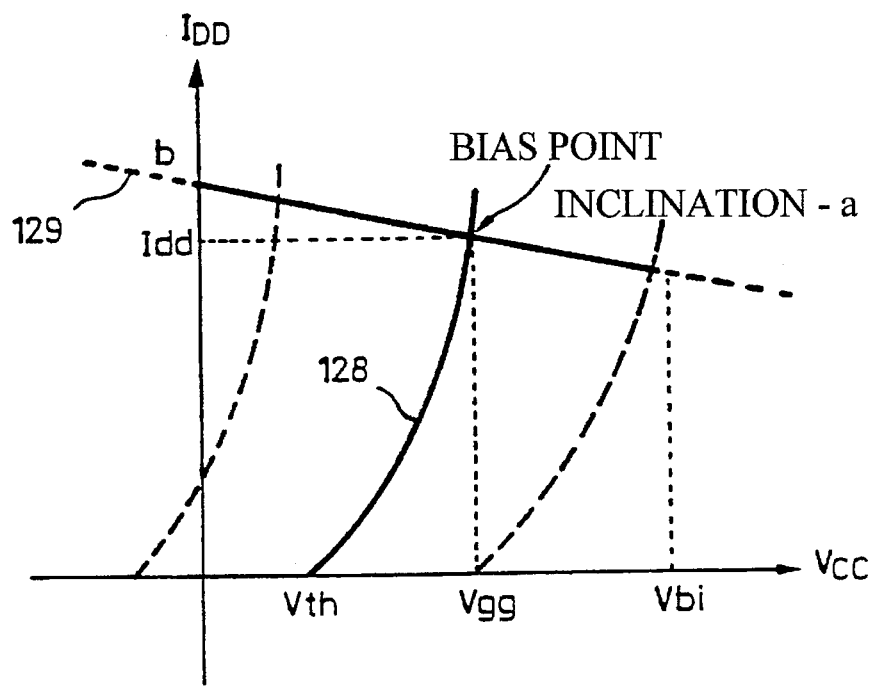
FIGS. 23 and 24 are a bias characteristic graph of the amplifying circuit shown in FIG. 22 and a diagram showing measured values, respectively.

The above equation (3) is expressed by a straight line 129 in FIG. 23, and the above-mentioned equation (7) is expressed by a curve 128 in FIG. 23. Incidentally, the curve 128 is fluctuated as shown by a broken curve when the threshold voltage Vth is fluctuated. Then, since the total sum $I_{dd}$ of the drain currents thus obtained in actual practice becomes a value at the intersecting point of the straight line 129 and the curve 128, an absolute value of a straight line inclination −a must be reduced as much as possible in order to reduce the fluctuation of the drain currents due to the fluctuation of the threshold voltage Vth of the FET 122.

If the emitter ground current amplification factor $h_{fe}$ of the transistor Q120 is selected to be several 100 s of ohms, the resistance values R121 and R122 are selected to b several kilo ohms and the resistance value R123 is selected to be several 100 s of ohms, then the second term of the numerator of the equation (4) is sufficiently small as compared with the first term and therefore can be neglected. Thus, a expressed by the equation (4) can be approximated by the following equation (8):

$$a=1/R124 \quad (8)$$

Accordingly, if a value of several kilo ohms is selected as the resistance value R124, then a becomes the order of $10^{-4}$. Therefore, even if the threshold voltage Vth is fluctuated by about 1 V, then the total sum $I_{dd}$ of the drain currents can be suppressed to be a small value of about zero point and several milliamperes.

Figure 24:
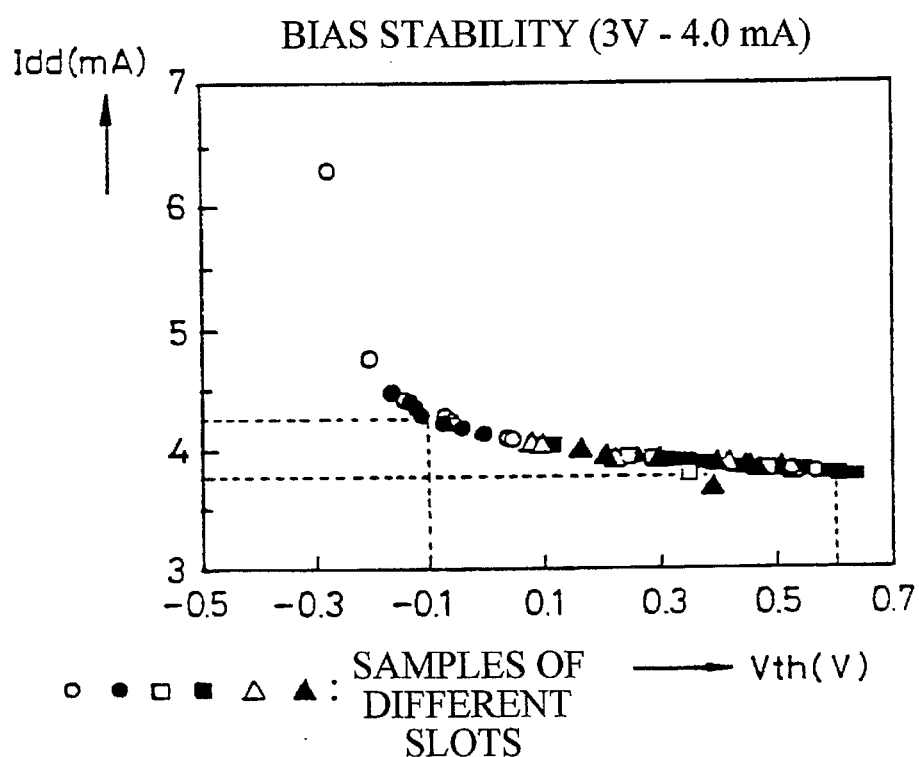

FIG. 24 shows examples of measured values of total sum $I_{dd}$ of other lot of the MMIC. Study of FIG. 24 reveals that the total sum $I_{dd}$ of the drain currents falls within a range of 4 mA±6% over a range in which the threshold voltage Vth falls in a range of −0.1 to 0.6 V, thereby obtaining a satisfactory stability.

Since the bias stabilizing circuit according to this embodiment of the present invention is operated by the single positive power supply, there is some different restriction shown by the equation (6). Since the voltage that is applied to the gate of the FET 122 in actual practice becomes such one that results from superimposing the input signal voltage from the input terminal Tin on the gate bias voltage $V_{gg}$, the gate bias voltage $V_{gg}$ must be set to a value that is lower than the diffusion potential $V_{bi}$ by at least about zero point and several Volts. In this case, if it is considered that a fluctuation relative to the threshold voltage Vth of B in the equation (7) is small, then the application range of the gate bias voltage $V_{gg}$ can be directly replaced with the tolerance fluctuation range of the threshold voltage Vth.

Accordingly, in the case of the GaAs MES-FET or HEMT (high speed electron mobility transistor) in which the diffusion potential $V_{bi}$ is about 0.6 to 0.7 V by using the Schottky junction, it is considered that the tolerance range of the threshold voltage Vth (gate bias voltage $V_{gg}$) is about 0.3 V at most. Accordingly, it is to be appreciated that the stability of the total sum $I_{dd}$ of the drain currents has not a so large predominance as compared with bias stabilizing circuits of other types. However, in the case of J-FET, the diffusion potential $V_{bi}$ is about 1.2 V so that a difference of the diffusion potential $V_{bi}$ leads to the enlargement of the tolerance range of the threshold voltage Vth as it is. Therefore, the value thereof becomes about 0.8 V and it is to be appreciated that the J-FET has a high predominance.

The bias circuit according to the eighth embodiment of the present invention can be wholly or partly formed within the monolithic IC as a part of the MMIC including the bipolar transistor Q100 and the capacitors.

Figure 25:
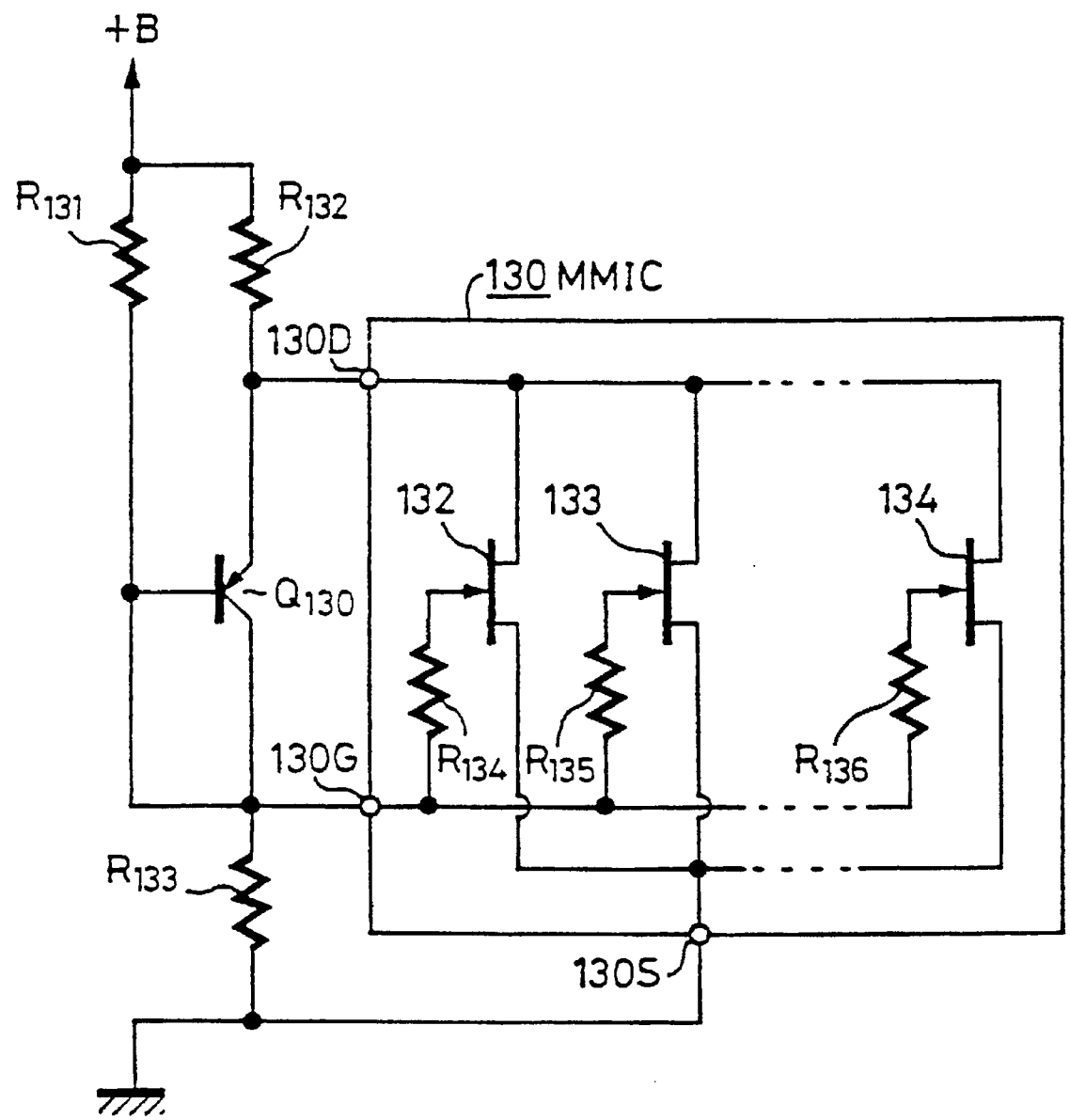
FIG. 25 is a schematic diagram showing a tenth embodiment of the FET bias circuit according to the present invention.
Figure 26:
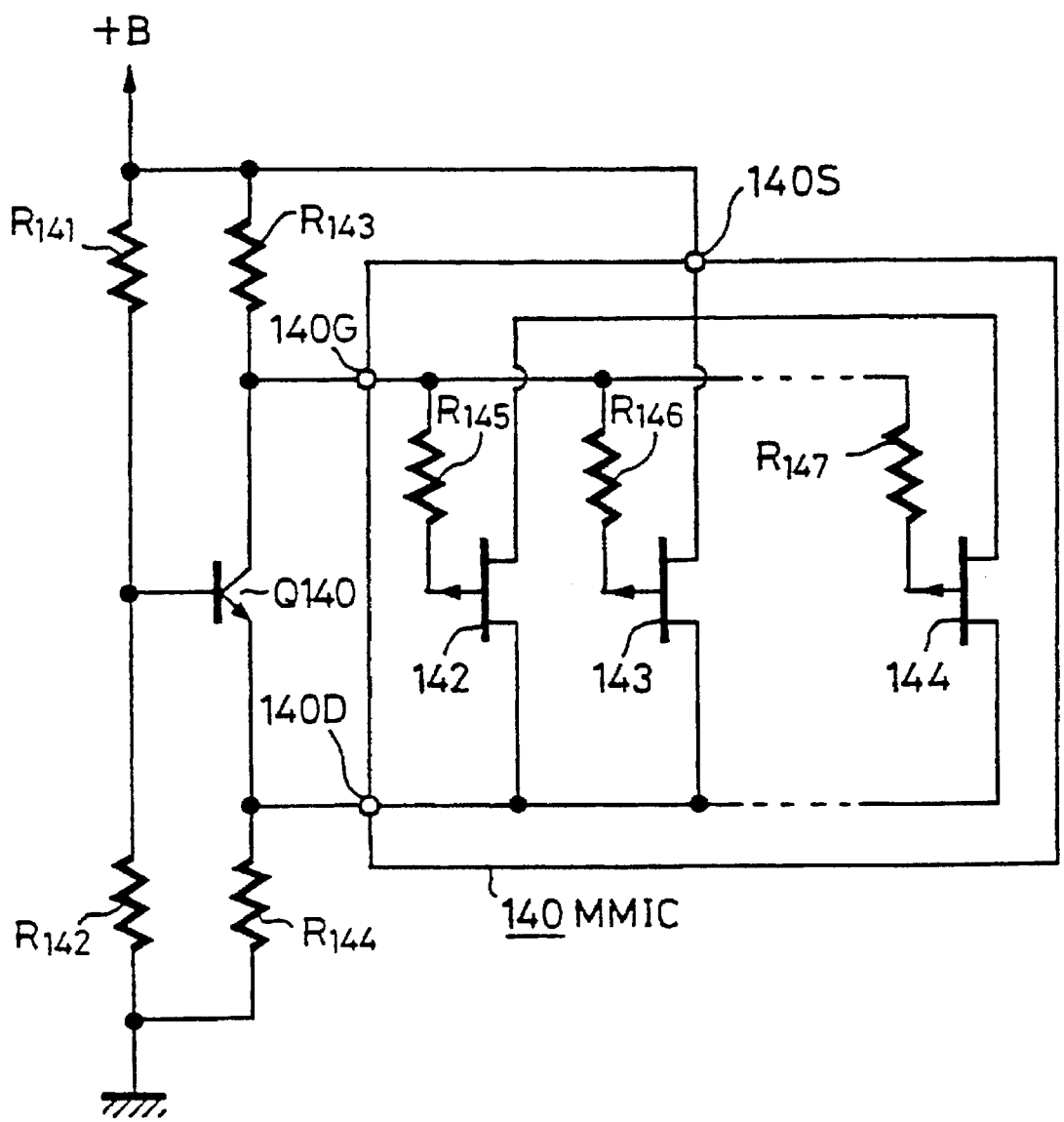
FIG. 26 is a schematic diagram showing an eleventh embodiment of the FET bias circuit according to the present invention.

FIGS. 25 and 26 show tenth and eleventh embodiments of the present invention, respectively. In the tenth embodiment shown in FIG. 25, a base of a transistor Q130 is directly coupled to the collector thereof. In the eleventh embodiment shown in FIG. 26, FETs 142, 143 and 144 within the MMIC are each formed of P-channel type FETs and a transistor Q140 is formed of an NPN-type transistor. Circuit arrangements and operations of the tenth and eleventh embodiments will not be described below.

While the FETs in the MMIC is formed of GaAs FETs as described above, the present invention is not limited thereto and may be formed of other compound semiconductor FETs. Further, the FETs within the MMIC according to the present invention is not limited to the J-FET and may be formed of MES-FETs, HEMTs or the like. Furthermore, the FET of the MMIC according to the present invention is not limited to the enhancement type FET and may be formed of a depletion type FET.

As described above, according to the present invention, there are provided the bias stabilizing circuit in which one output electrode of the bipolar transistor in which the bias voltage is applied to the base thereof is connected to the power supply through the first resistor and the other output electrode thereof is grounded through the second resistor and the FET that is formed of the compound semiconductor and which is biased by the above bias stabilizing circuit. Further, one output electrode of the bipolar transistor is connected to the one output electrode of the FET and the other output electrode of the bipolar transistor is connected to the gate of the FET. Therefore, the bias stability is high and the tolerance fluctuation width of the threshold voltage is wide, which is therefore advantageous from a manufacturing technology standpoint. Therefore, it is possible to obtain the bias stabilizing circuit for a field effect transistor formed of a compound semiconductor which can be driven by the single low voltage power supply.

Furthermore, when the FET is formed of the J-FET, the tolerance fluctuation width of the threshold voltage can be widened more as compared with the FETs of other kinds.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A microwave semiconductor integrated circuit, comprising:

a mixer circuit formed of an active circuit element field effect transistor having its source-drain path connected between an RF input and IF output, a first resistor connected at an RF input side of the source-drain path to ground and a second resistor connected between an IF output side of the source-drain path to ground, and a gate of the mixing circuit connecting to a local oscillator as an input; and a bias circuit comprising an enhancement mode field effect transistor having its source directly connected to ground, its gate connecting through a third resistor to the gate of the mixer circuit field effect transistor, the gate also connecting directly to the drain of the bias circuit field effect transistor, and a fourth resistor connecting the drain of the bias circuit field effect transistor to a power supply potential.

2. A circuit according to claim 1 wherein a first capacitor connects between the mixer circuit field effect transistor and the RF input, a second capacitor is connected between the IF output and the mixer circuit field effect transistor, a third capacitor is connected between the gate of the mixer circuit field effect transistor and the local oscillator input, and a fourth capacitor is connected between the gate of the bias circuit field effect transistor and ground.

* * * * *